(12) United States Patent
Shionoiri et al.

(10) Patent No.: US 8,929,128 B2
(45) Date of Patent: Jan. 6, 2015

(54) STORAGE DEVICE AND WRITING METHOD OF THE SAME

(71) Applicant: Semiconductor Energy Laboratory Co., Ltd., Atsugi-shi, Kanagawa ken (JP)

(72) Inventors: Yutaka Shionoiri, Kanagawa (JP); Seiko Inoue, Kanagawa (JP)

(73) Assignee: Semiconductor Energy Laboratory Co., Ltd., Atsugi-shi, Kanagawa-ken (JP)

(*) Notice: Subject to any disclaimer, the term of this patent is extended or adjusted under 35 U.S.C. 154(b) by 0 days.

(21) Appl. No.: 13/892,458

(22) Filed: May 13, 2013

(65) Prior Publication Data

US 2013/0308372 A1 Nov. 21, 2013

(30) Foreign Application Priority Data

May 17, 2012 (JP) ................................ 2012-113102

(51) Int. Cl.
*G11C 11/24* (2006.01)
*G11C 11/409* (2006.01)
*G11C 11/4076* (2006.01)
*G11C 11/408* (2006.01)

(52) U.S. Cl.
CPC .......... *G11C 11/409* (2013.01); *G11C 11/4076* (2013.01); *G11C 11/4087* (2013.01)
USPC ..................... 365/149; 365/189.05

(58) Field of Classification Search
CPC ...... G11C 11/16; G11C 11/5678; G11C 8/08; G11C 13/0004; G11C 2213/79
USPC ........ 365/63, 72, 148, 154, 158, 189.01, 194, 365/214, 226, 227, 228, 230.06, 189.05; 327/227, 284, 535, 536, 537
See application file for complete search history.

(56) References Cited

U.S. PATENT DOCUMENTS 4,740,918 A * 4/1988 Okajima et al. ................ 365/72
5,528,032 A 6/1996 Uchiyama
(Continued)

FOREIGN PATENT DOCUMENTS

EP 1 737 044 A1 12/2006
EP 2 226 847 A2 9/2010
(Continued)

OTHER PUBLICATIONS

Asakuma, N et al., "Crystallization and Reduction of Sol-Gel-Derived Zinc Oxide Films by Irradiation With Ultraviolet Lamp," Journal of Sol-Gel Science and Technology, 2003, vol. 26, pp. 181-184.

(Continued)

*Primary Examiner* — Michael Tran
(74) *Attorney, Agent, or Firm* — Fish & Richardson P.C.

(57) ABSTRACT

A storage device in which held voltage is prevented from decreasing due to feedthrough in writing data to the storage device at high voltage is provided. The storage device includes a write circuit, a bit line, a word line, a transistor, and a capacitor. A gate of the transistor is electrically connected to the word line. One of a source and a drain of the transistor is electrically connected to the bit line. The other of the source and the drain of the transistor is electrically connected to one terminal of the capacitor. The other terminal of the capacitor is electrically connected to a ground. The write circuit includes an element holding write voltage and a circuit gradually decreasing voltage from the element holding write voltage. The write voltage is output from the write circuit to the word line.

19 Claims, 10 Drawing Sheets

(56) References Cited

U.S. PATENT DOCUMENTS

| | | | |
|---|---|---|---|
| 5,532,969 A * | 7/1996 | Houghton et al. | 365/185.16 |
| 5,583,821 A * | 12/1996 | Rose et al. | 365/156 |
| 5,694,355 A * | 12/1997 | Skjaveland et al. | 365/149 |
| 5,731,856 A | 3/1998 | Kim et al. | |
| 5,744,864 A | 4/1998 | Cillessen et al. | |
| 6,294,274 B1 | 9/2001 | Kawazoe et al. | |
| 6,563,174 B2 | 5/2003 | Kawasaki et al. | |
| 6,727,522 B1 | 4/2004 | Kawasaki et al. | |
| 7,049,190 B2 | 5/2006 | Takeda et al. | |
| 7,061,014 B2 | 6/2006 | Hosono et al. | |
| 7,064,346 B2 | 6/2006 | Kawasaki et al. | |
| 7,105,868 B2 | 9/2006 | Nause et al. | |
| 7,211,825 B2 | 5/2007 | Shih et al | |
| 7,282,782 B2 | 10/2007 | Hoffman et al. | |
| 7,297,977 B2 | 11/2007 | Hoffman et al. | |
| 7,323,356 B2 | 1/2008 | Hosono et al. | |
| 7,385,224 B2 | 6/2008 | Ishii et al. | |
| 7,402,506 B2 | 7/2008 | Levy et al. | |
| 7,411,209 B2 | 8/2008 | Endo et al. | |
| 7,453,065 B2 | 11/2008 | Saito et al. | |
| 7,453,087 B2 | 11/2008 | Iwasaki | |
| 7,462,862 B2 | 12/2008 | Hoffman et al. | |
| 7,468,304 B2 | 12/2008 | Kaji et al. | |
| 7,501,293 B2 | 3/2009 | Ito et al. | |
| 7,674,650 B2 | 3/2010 | Akimoto et al. | |
| 7,732,819 B2 | 6/2010 | Akimoto et al. | |
| 2001/0046027 A1 | 11/2001 | Tai et al. | |
| 2002/0056838 A1 | 5/2002 | Ogawa | |
| 2002/0132454 A1 | 9/2002 | Ohtsu et al. | |
| 2003/0189401 A1 | 10/2003 | Kido et al. | |
| 2003/0218222 A1 | 11/2003 | Wager, III et al. | |
| 2004/0038446 A1 | 2/2004 | Takeda et al. | |
| 2004/0127038 A1 | 7/2004 | Carcia et al. | |
| 2005/0017302 A1 | 1/2005 | Hoffman | |
| 2005/0199959 A1 | 9/2005 | Chiang et al. | |
| 2006/0035452 A1 | 2/2006 | Carcia et al. | |
| 2006/0043377 A1 | 3/2006 | Hoffman et al. | |
| 2006/0091793 A1 | 5/2006 | Baude et al. | |
| 2006/0108529 A1 | 5/2006 | Saito et al. | |
| 2006/0108636 A1 | 5/2006 | Sano et al. | |
| 2006/0110867 A1 | 5/2006 | Yabuta et al. | |
| 2006/0113536 A1 | 6/2006 | Kumomi et al. | |
| 2006/0113539 A1 | 6/2006 | Sano et al. | |
| 2006/0113549 A1 | 6/2006 | Den et al. | |
| 2006/0113565 A1 | 6/2006 | Abe et al. | |
| 2006/0169973 A1 | 8/2006 | Isa et al. | |
| 2006/0170111 A1 | 8/2006 | Isa et al. | |
| 2006/0197092 A1 | 9/2006 | Hoffman et al. | |
| 2006/0208977 A1 | 9/2006 | Kimura | |
| 2006/0228974 A1 | 10/2006 | Thelss et al. | |
| 2006/0231882 A1 | 10/2006 | Kim et al. | |
| 2006/0238135 A1 | 10/2006 | Kimura | |
| 2006/0244107 A1 | 11/2006 | Sugihara et al. | |
| 2006/0284171 A1 | 12/2006 | Levy et al. | |
| 2006/0284172 A1 | 12/2006 | Ishii | |
| 2006/0292777 A1 | 12/2006 | Dunbar | |
| 2007/0024187 A1 | 2/2007 | Shin et al. | |
| 2007/0046191 A1 | 3/2007 | Saito | |
| 2007/0052025 A1 | 3/2007 | Yabuta | |
| 2007/0054507 A1 | 3/2007 | Kaji et al. | |
| 2007/0090365 A1 | 4/2007 | Hayashi et al. | |
| 2007/0108446 A1 | 5/2007 | Akimoto | |
| 2007/0152217 A1 | 7/2007 | Lai et al. | |
| 2007/0172591 A1 | 7/2007 | Seo et al. | |
| 2007/0187678 A1 | 8/2007 | Hirao et al. | |
| 2007/0187760 A1 | 8/2007 | Furuta et al. | |
| 2007/0194379 A1 | 8/2007 | Hosono et al. | |
| 2007/0252928 A1 | 11/2007 | Ito et al. | |
| 2007/0272922 A1 | 11/2007 | Kim et al. | |
| 2007/0287296 A1 | 12/2007 | Chang | |
| 2008/0006877 A1 | 1/2008 | Mardilovich et al. | |
| 2008/0038882 A1 | 2/2008 | Takechi et al. | |
| 2008/0038929 A1 | 2/2008 | Chang | |
| 2008/0050595 A1 | 2/2008 | Nakagawara et al. | |
| 2008/0073653 A1 | 3/2008 | Iwasaki | |
| 2008/0083950 A1 | 4/2008 | Pan et al. | |
| 2008/0106191 A1 | 5/2008 | Kawase | |
| 2008/0128689 A1 | 6/2008 | Lee et al. | |
| 2008/0129195 A1 | 6/2008 | Ishizaki et al. | |
| 2008/0166834 A1 | 7/2008 | Kim et al. | |
| 2008/0182358 A1 | 7/2008 | Cowdery-Corvan et al. | |
| 2008/0224133 A1 | 9/2008 | Park et al. | |
| 2008/0254569 A1 | 10/2008 | Hoffman et al. | |
| 2008/0258139 A1 | 10/2008 | Ito et al. | |
| 2008/0258140 A1 | 10/2008 | Lee et al. | |
| 2008/0258141 A1 | 10/2008 | Park et al. | |
| 2008/0258143 A1 | 10/2008 | Kim et al. | |
| 2008/0296568 A1 | 12/2008 | Ryu et al. | |
| 2009/0068773 A1 | 3/2009 | Lai et al. | |
| 2009/0073325 A1 | 3/2009 | Kuwabara et al. | |
| 2009/0114910 A1 | 5/2009 | Chang | |
| 2009/0134399 A1 | 5/2009 | Sakakura et al. | |
| 2009/0152506 A1 | 6/2009 | Umeda et al. | |
| 2009/0152541 A1 | 6/2009 | Maekawa et al. | |
| 2009/0278122 A1 | 11/2009 | Hosono et al. | |
| 2009/0280600 A1 | 11/2009 | Hosono et al. | |
| 2010/0065844 A1 | 3/2010 | Tokunaga | |
| 2010/0092800 A1 | 4/2010 | Itagaki et al. | |
| 2010/0109002 A1 | 5/2010 | Itagaki et al. | |
| 2011/0089419 A1 | 4/2011 | Yamazaki et al. | |
| 2011/0116310 A1 | 5/2011 | Yamazaki et al. | |
| 2011/0128777 A1 | 6/2011 | Yamazaki et al. | |
| 2011/0156024 A1 * | 6/2011 | Koyama et al. | 257/43 |
| 2012/0033505 A1 | 2/2012 | Sekine et al. | |

FOREIGN PATENT DOCUMENTS

| | | |
|---|---|---|
| JP | 60-198861 A | 10/1985 |
| JP | 63-210022 A | 8/1988 |
| JP | 63-210023 A | 8/1988 |
| JP | 63-210024 A | 8/1988 |
| JP | 63-215519 A | 9/1988 |
| JP | 63-239117 A | 10/1988 |
| JP | 63-265818 A | 11/1988 |
| JP | 05-251705 A | 9/1993 |
| JP | 06-275697 A | 9/1994 |
| JP | 08-264794 A | 10/1996 |
| JP | 11-505377 A | 5/1999 |
| JP | 2000-044236 A | 2/2000 |
| JP | 2000-149551 A | 5/2000 |
| JP | 2000-150900 A | 5/2000 |
| JP | 2002-076356 A | 3/2002 |
| JP | 2002-289859 A | 10/2002 |
| JP | 2003-086000 A | 3/2003 |
| JP | 2003-086808 A | 3/2003 |
| JP | 2004-103957 A | 4/2004 |
| JP | 2004-273614 A | 9/2004 |
| JP | 2004-273732 A | 9/2004 |
| JP | 2011-109084 A | 6/2011 |
| WO | 2004/114391 A1 | 12/2004 |

OTHER PUBLICATIONS

Asaoka, Y et al., "29.1: Polarizer-Free Reflective LCD Combined With Ultra Low-Power Driving Technology," SID Digest '09 : SID International Symposium Digest of Technical Papers, 2009, pp. 395-398.

Chern, H et al., "An Analytical Model for the Above-Threshold Characteristics of Polysilicon Thin-Film Transistors," IEEE Transactions on Electron Devices, Jul. 1, 1995, vol. 42, No. 7, pp. 1240-1246.

Cho, D et al., "21.2: Al and Sn-Doped Zinc Indium Oxide Thin Film Transistors for AMOLED Back-Plane," SID Digest '09 : SID International Symposium Digest of Technical Papers, May 31, 2009, pp. 280-283.

Clark, S et al., "First Principles Methods Using Castep," Zeitschrift fur Kristallographie, 2005, vol. 220, pp. 567-570.

Coates. D et al., Optical Studies of the Amorphous Liquid-Cholesteric Liquid Crystal Transition: The "Blue Phase," Physics Letters, Sep. 10, 1973, vol. 45A, No. 2, pp. 115-116.

Costello, M et al., "Electron Microscopy of a Cholesteric Liquid Crystal and Its Blue Phase," Phys. Rev. A (Physical Review. A), May 1, 1984, vol. 29, No. 5, pp. 2957-2959.

(56) References Cited

OTHER PUBLICATIONS

Dembo, H et al., "RFCPUS on Glass and Plastic Substrates Fabricated by TFT Transfer Technology," IEDM 05: Technical Digest of International Electron Devices Meeting, Dec. 5, 2005, pp. 1067-1069.

Fortunato, E et al., "Wide-Bandgap High-Mobility ZnO Thin-Film Transistors Produced at Room Temperature," Appl. Phys. Lett. (Applied Physics Letters), Sep. 27, 2004, vol. 85, No. 13, pp. 2541-2543.

Fung, T et al., "2-D Numerical Simulation of High Performance Amorphous In—Ga—Zn—O TFTs for Flat Panel Displays," AM-FPD '08 Digest of Technical Papers, Jul. 2, 2008, pp. 251-252, The Japan Society of Applied Physics.

Godo, H et al., "P-9: Numerical Analysis on Temperature Dependence of Characteristics of Amorphous In—Ga—Zn—Oxide TFT," SID Digest '09 : SID International Symposium Digest of Technical Papers, May 31, 2009, pp. 1110-1112.

Godo, H et al., "Temperature Dependence of Characteristics and Electronic Structure for Amorphous In—Ga—Zn—Oxide TFT," AM-FPD '09 Digest of Technical Papers, Jul. 1, 2009, pp. 41-44.

Hayashi, R et al., "42.1: Invited Paper: Improved Amorphous In—Ga—Zn—0 TFTs," SID Digest '08 : SID International Symposium Digest of Technical Papers, May 20, 2008, vol. 39, pp. 621-624.

Hirao, T et al., "Novel Top-Gate Zinc Oxide Thin-Film Transistors (ZnO TFTs) for AMLCDs," Journal of the SID , 2007, vol. 15, No. 1, pp. 17-22.

Hosono, H et al., "Working hypothesis to explore novel wide band gap electrically conducting amorphous oxides and examples," J. Non-Cryst. Solids (Journal of Non-Crystalline Solids), 1996, vol. 198-200, pp. 165-169.

Hosono, H, "68.3: Invited Paper:Transparent Amorphous Oxide Semiconductors for High Performance TFT," SID Digest '07 : SID International Symposium Digest of Technical Papers, 2007, vol. 38, pp. 1830-1833.

Hsieh, H et al., "P-29: Modeling of Amorphous Oxide Semiconductor Thin Film Transistors and Subgap Density of States," SID Digest '08 : SID International Symposium Digest of Technical Papers, 2008, vol. 39, pp. 1277-1280.

Ikeda, T et al., "Full-Functional System Liquid Crystal Display Using CG-Silicon Technology," SID Digest '04 : SID International Symposium Digest of Technical Papers, 2004, vol. 35, pp. 860-863.

Janotti, A et al., "Native Point Defects in ZnO," Phys. Rev. B (Physical Review. B), 2007, vol. 76, No. 16, pp. 165202-1-165202-22.

Janotti, A et al., "Oxygen Vacancies in ZnO," Appl. Phys. Lett. (Applied Physics Letters), 2005, vol. 87, pp. 122102-1-122102-3.

Jeong, J et al., "3.1: Distinguished Paper: 12.1-Inch WXGA AMOLED Display Driven by Indium—Gallium—Zinc Oxide TFTs Array," SID Digest '08 : SID International Symposium Digest of Technical Papers, May 20, 2008, vol. 39, No. 1, pp. 1-4.

Jin, D et al., "65.2: Distinguished Paper:World-Largest (6.5") Flexible Full Color Top Emission AMOLED Display on Plastic Film and Its Bending Properties," SID Digest '09 : SID International Symposium Digest of Technical Papers, May 31, 2009, pp. 983-985.

Kanno, H et al., "White Stacked Electrophosphorecent Organic Light-Emitting Devices Employing MOO3 as a Charge-Generation Layer," Adv. Mater. (Advanced Materials), 2006, vol. 18, No. 3, pp. 339-342.

Kikuchi, H et al., "39.1: Invited Paper: Optically Isotropic Nano-Structured Liquid Crystal Composites for Display Applications," SID Digest '09 : SID International Symposium Digest of Technical Papers, May 31, 2009, pp. 578-581.

Kikuchi, H et al., "62.2: Invited Paper: Fast Electro-Optical Switching in Polymer-Stabilized Liquid Crystalline Blue Phases for Display Application," SID Digest '07 : SID International Symposium Digest of Technical Papers, 2007, vol. 38, pp. 1737-1740.

Kikuchi, H et al., "Polymer-Stabilized Liquid Crystal Blue Phases," Nature Materials, Sep. 1, 2002, vol. 1, pp. 64-68.

Kim, S et al., "High-Performance oxide thin film transistors passivated by various gas plasmas," The Electrochemical Society, 214th ECS Meeting, 2008, No. 2317, 1 page.

Kimizuka, N. et al., "Spinel,YBFE2O4, and YB2FE3O7 Types of Structures for Compounds in the IN2O3 and SC2O3—A2O3—BO Systems [A; Fe, Ga, or Al; B: Mg, Mn, Fe, Ni, Cu,Or Zn] at Temperatures Over 1000° C.," Journal of Solid State Chemistry, 1985, vol. 60, pp. 382-384.

Kimizuka, N et al., "Syntheses and Single-Crystal Data of Homologous Compounds, In2O3(ZnO)m (m = 3, 4, and 5), InGaO3(ZnO)3, and Ga2O3(ZnO)m (m = 7, 8, 9, and 16) in the In2O3—ZnGa2O4—ZnO System," Journal of Solid State Chemistry, Apr. 1, 1995, vol. 116, No. 1, pp. 170-178.

Kitzerow, H et al., "Observation of Blue Phases in Chiral Networks," Liquid Crystals, 1993, vol. 14, No. 3, pp. 911-916.

Kurokawa, Y et al., "UHF RFCPUS on Flexible and Glass Substrates for Secure RFID Systems," Journal of Solid-State Circuits , 2008, vol. 43, No. 1, pp. 292-299.

Lany, S et al., "Dopability, Intrinsic Conductivity, and Nonstoichiometry of Transparent Conducting Oxides," Phys. Rev. Lett. (Physical Review Letters), Jan. 26, 2007, vol. 98, pp. 045501-1-045501-4.

Lee, H et al., "Current Status of, Challenges to, and Perspective View of AM-OLED," IDW '06 : Proceedings of the 13th International Display Workshops, Dec. 7, 2006, pp. 663-666.

Lee, J et al., "World'S Largest (15-Inch) XGA AMLCD Panel Using IGZO Oxide TFT," SID Digest '08 : SID International Symposium Digest of Technical Papers, May 20, 2008, vol. 39, pp. 625-628.

Lee, M et al., "15.4: Excellent Performance of Indium—Oxide-Based Thin-Film Transistors by DC Sputtering," SID Digest '09 : SID International Symposium Digest of Technical Papers, May 31, 2009, pp. 191-193.

Li, C et al "Modulated Structures of Homologous Compounds InMO3(ZnO)m (M=In,Ga; m=Integer) Described by Four-Dimensional Superspace Group," Journal of Solid State Chemistry, 1998, vol. 139, pp. 347-355.

Masuda, S et al., "Transparent thin film transistors using ZnO as an active channel layer and their electrical properties," J. Appl. Phys. (Journal of Applied Physics), Feb. 1, 2003, vol. 93, No. 3, pp. 1624-1630.

Meiboom, S et al., "Theory of the Blue Phase of Cholesteric Liquid Crystals," Phys. Rev. Lett. (Physical Review Letters), May 4, 1981, vol. 46, No. 18, pp. 1216-1219.

Miyasaka, M, "Suftla Flexible Microelectronics on Their Way to Business," SID Digest '07 : SID International Symposium Digest of Technical Papers, 2007, vol. 38, pp. 1673-1676.

Mo, Y et al., "Amorphous Oxide TFT Backplanes for Large Size AMOLED Displays," IDW '08 : Proceedings of the 6th International Display Workshops, Dec. 3, 2008, pp. 581-584.

Nakamura, "Synthesis of Homologous Compound with New Long-Period Structure," NIRIM Newsletter, Mar. 1995, vol. 150, pp. 1-4 with English translation.

Nakamura, M et al., "The phase relations in the In2O3—Ga2ZnO4—ZnO system at 1350° C.," Journal of Solid State Chemistry, Aug. 1, 1991, vol. 93, No. 2, pp. 298-315.

Nomura, K et al., "Thin-Film Transistor Fabricated in Single-Crystalline Transparent Oxide Semiconductor," Science, May 23, 2003, vol. 300, No. 5623, pp. 1269-1272.

Nomura, K et al., "Amorphous Oxide Semiconductors for High-Performance Flexible Thin-Film Transistors," JPN. J. Appl. Phys. (Japanese Journal of Applied Physics) , 2006, vol. 45, No. 5B, pp. 4303-4308.

Nomura, K et al., "Room-Temperature Fabrication of Transparent Flexible Thin-Film Transistors Using Amorphous Oxide Semiconductors," Nature, Nov. 25, 2004, vol. 432, pp. 488-492.

Nomura, K et al., "Carrier transport in transparent oxide semiconductor with intrinsic structural randomness probed using single-crystalline InGaO3(ZnO)5 films," Appl. Phys. Lett. (Applied Physics Letters) , Sep. 13, 2004, vol. 85, No. 11, pp. 1993-1995.

Nowatari, H et al., "60.2: Intermediate Connector With Suppressed Voltage Loss for White Tandem OLEDs," SID Digest '09 : SID International Symposium Digest of Technical Papers, May 31, 2009, vol. 40, pp. 899-902.

Oba, F et al., "Defect energetics in ZnO: A hybrid Hartree-Fock density functional study," Phys. Rev. B (Physical Review. B), 2008, vol. 77, pp. 245202-1-245202-6.

(56) References Cited

OTHER PUBLICATIONS

Oh, M et al., "Improving the Gate Stability of ZnO Thin-Film Transistors With Aluminum Oxide Dielectric Layers," J. Electrochem. Soc. (Journal of the Electrochemical Society), 2008, vol. 155, No. 12, pp. H1009-H1014.

Ohara, H et al., "21.3: 4.0 IN. QVGA AMOLED Display Using In—Ga—Zn—Oxide TFTs With a Novel Passivation Layer," SID Digest '09 : SID International Symposium Digest of Technical Papers, May 31, 2009, pp. 284-287.

Ohara, H et al., "Amorphous In—Ga—Zn—Oxide TFTs with Suppressed Variation for 4.0 inch QVGA AMOLED Display," AM-FPD '09 Digest of Technical Papers, Jul. 1, 2009, pp. 227-230, The Japan Society of Applied Physics.

Orita, M et al., "Amorphous transparent conductive oxide InGaO3(ZnO)m (m<4):a Zn4s conductor," Philosophical Magazine, 2001, vol. 81, No. 5, pp. 501-515.

Orita, M et al., "Mechanism of Electrical Conductivity of Transparent InGaZnO4," Phys. Rev. B (Physical Review. B), Jan. 15, 2000, vol. 61, No. 3, pp. 1811-1816.

Osada, T et al., "15.2: Development of Driver-Integrated Panel using Amorphous In—Ga—Zn—Oxide TFT," SID Digest '09 : SID International Symposium Digest of Technical Papers, May 31, 2009, pp. 184-187.

Osada, T et al., "Development of Driver-Integrated Panel Using Amorphous In—Ga—Zn—Oxide TFT," AM-FPD '09 Digest of Technical Papers, Jul. 1, 2009, pp. 33-36.

Park, J et al., "Dry etching of ZnO films and plasma-induced damage to optical properties," J. Vac. Sci. Technol. B (Journal of Vacuum Science & Technology B), Mar. 1, 2003, vol. 21, No. 2, pp. 800-803.

Park, J et al., "Improvements in the Device Characteristics of Amorphous Indium Gallium Zinc Oxide Thin-Film Transistors by Ar Plasma Treatment," Appl. Phys. Lett. (Applied Physics Letters), Jun. 26, 2007, vol. 90, No. 26, pp. 262106-1-262106-3.

Park, J et al., "Electronic Transport Properties of Amorphous Indium—Gallium—Zinc Oxide Semiconductor Upon Exposure to Water," Appl. Phys. Lett. (Applied Physics Letters), 2008, vol. 92, pp. 072104-1-072104-3.

Park, J et al., "High performance amorphous oxide thin film transistors with self-aligned top-gate structure," IEDM 09: Technical Digest of International Electron Devices Meeting, Dec. 7, 2009, pp. 191-194.

Park, Sang-Hee et al., "42.3: Transparent ZnO Thin Film Transistor for the Application of High Aperture Ratio Bottom Emission AM-OLED Display," SID Digest '08 : SID International Symposium Digest of Technical Papers, May 20, 2008, vol. 39, pp. 629-632.

Park, J et al., "Amorphous Indium—Gallium—Zinc Oxide TFTs and Their Application for Large Size AMOLED," AM-FPD '08 Digest of Technical Papers, Jul. 2, 2008, pp. 275-278.

Park, S et al., "Challenge to Future Displays: Transparent AM-OLED Driven by Peald Grown ZnO TFT," IMID '07 Digest, 2007, pp. 1249-1252.

Prins, M et al., "A Ferroelectric Transparent Thin-Film Transistor," Appl. Phys. Lett. (Applied Physics Letters), Jun. 17, 1996, vol. 68, No. 25, pp. 3650-3652.

Sakata, J et al., "Development of 4.0-In. AMOLED Display With Driver Circuit Using Amorphous In—Ga—Zn—Oxide TFTs," IDW '09 : Proceedings of the 16th International Display Workshops, 2009, pp. 689-692.

Son, K et al., "42.4L: Late-News Paper: 4 Inch QVGA AMOLED Driven by the Threshold Voltage Controlled Amorphous GIZO (Ga2O3—In2O3—ZnO) TFT," SID Digest '08 : SID International Symposium Digest of Technical Papers, May 20, 2008, vol. 39, pp. 633-636.

Takahashi, M et al., "Theoretical Analysis of IGZO Transparent Amorphous Oxide Semiconductor," IDW '08 : Proceedings of the 15th International Display Workshops, Dec. 3, 2008, pp. 1637-1640.

Tsuda, K et al., "Ultra Low Power Consumption Technologies for Mobile TFT-LCDs," IDW '02 : Proceedings of the 9th International Display Workshops, Dec. 4, 2002, pp. 295-298.

Ueno, K et al., "Field-Effect Transistor on SrTiO3 With Sputtered Al2O3 Gate Insulator," Appl. Phys. Lett. (Applied Physics Letters), Sep. 1, 2003, vol. 83, No. 9, pp. 1755-1757.

Van De Walle, C, "Hydrogen as a Cause of Doping in Zinc Oxide," Phys. Rev. Lett. (Physical Review Letters), Jul. 31, 2000, vol. 85, No. 5, pp. 1012-1015.

\* cited by examiner

STORAGE DEVICE AND WRITING METHOD OF THE SAME

BACKGROUND OF THE INVENTION

1. Field of the Invention

The present invention relates to storage devices and writing methods of the storage devices.

2. Description of the Related Art

Examples of storage devices used for semiconductor integrated circuits and the like include dynamic random access memories (DRAMs) which are volatile storage devices. DRAMs are storage devices storing data by holding electric charge in capacitors.

These days, storage devices including oxide semiconductor (OS) transistors are studied, and nonvolatile storage devices having structures that are similar to the structures of DRAMs are disclosed (see Patent Document 1). An oxide semiconductor has a wide bandgap (for example, approximately 3 eV) and large hole effective mass. Thus, the oxide semiconductor has extremely low off-state leakage current (leakage current of a transistor in an off state). Accordingly, the use of an oxide semiconductor for a transistor in a DRAM can achieve long-term holding of electric charge in a capacitor.

In order to correctly write data to a storage device such as a DRAM, a method for stepping up write voltage from power supply voltage is employed (for example, see Patent Document 2). Further, by stepping up write voltage, on-state current of a write transistor is increased; thus, write time can be shortened.

REFERENCE

[Patent Document 1] Japanese Published Patent Application No. 2011-109084

[Patent Document 2] Japanese Published Patent Application No. 2000-149551

SUMMARY OF THE INVENTION

When data is written while write voltage of a DRAM is stepped up as described above, a phenomenon of feedthrough is caused by interruption of the write voltage after the data is written at high voltage (electric charge is held in a capacitor). The voltage written to and held in the capacitor is decreased due to the feedthrough. In addition, the voltage is decreased due to the feedthrough as the write voltage is increased.

In view of the foregoing problems, it is an object of one embodiment of the present invention to provide a storage device in which held voltage is prevented from decreasing due to feedthrough in writing data to the storage device at high voltage.

It is an object of one embodiment of the present invention to provide a writing method of a storage device in which held voltage is prevented from decreasing due to feedthrough in writing data to the storage device at high voltage.

The scope of the present invention is to shorten write time and reduce a decrease in voltage due to feedthrough by writing data to a storage device at voltage stepped up from power supply voltage and gradually decreasing write voltage after the data is fixed.

One embodiment of the present invention is a storage device that includes a write circuit, a bit line, a word line, a transistor, and a capacitor. A gate of the transistor is electrically connected to the word line. One of a source and a drain of the transistor is electrically connected to the bit line. The other of the source and the drain of the transistor is electrically connected to one terminal of the capacitor. The other terminal of the capacitor is electrically connected to a ground. The write circuit includes an element holding write voltage and a circuit gradually decreasing voltage from the element holding write voltage. The write voltage is output from the write circuit to the word line.

In one embodiment of the present invention, the transistor preferably includes an oxide semiconductor film. Thus, the storage device can be nonvolatile.

One embodiment of the present invention is a storage device that includes a write circuit, a bit line, a word line, a first transistor, and a second transistor. A gate of the first transistor is electrically connected to the word line. One of a source and a drain of the first transistor is electrically connected to the bit line. The other of the source and the drain of the first transistor is electrically connected to a gate of the second transistor. The write circuit includes an element holding write voltage and a circuit gradually decreasing voltage from the element holding write voltage. The write voltage is output from the write circuit to the word line.

In one embodiment of the present invention, the first transistor preferably includes an oxide semiconductor film. Thus, the storage device can be nonvolatile.

In one embodiment of the present invention, a capacitor electrically connected to the other of the source and the drain of the first transistor and the gate of the second transistor may be provided.

In one embodiment of the present invention, the element holding write voltage can be a storage capacitor. In addition, the circuit gradually decreasing voltage can be a constant current circuit.

One embodiment of the present invention is a writing method of a storage device including a memory element storing data and a write circuit supplying voltage for writing data. The method includes a first write step of outputting voltage stepped up from power supply voltage from the write circuit to the memory element and a second write step of outputting the stepped up voltage from the write circuit to the memory element while gradually decreasing the voltage.

One embodiment of the present invention may be a writing method of a storage device in which the second write step is performed after the first write step is performed for a certain period.

One embodiment of the present invention may be a writing method of a storage device in which supply of voltage from the write circuit is interrupted in the second write step.

In one embodiment of the present invention, the memory element preferably includes a transistor including an oxide semiconductor film.

According to one embodiment of the present invention, it is possible to provide a storage device in which held voltage is prevented from decreasing due to feedthrough in writing data to the storage device at high voltage.

According to one embodiment of the present invention, it is possible to provide a writing method of a storage device in which held voltage is prevented from decreasing due to feedthrough in writing data to the storage device at high voltage.

DETAILED DESCRIPTION OF THE INVENTION

Figure 1:
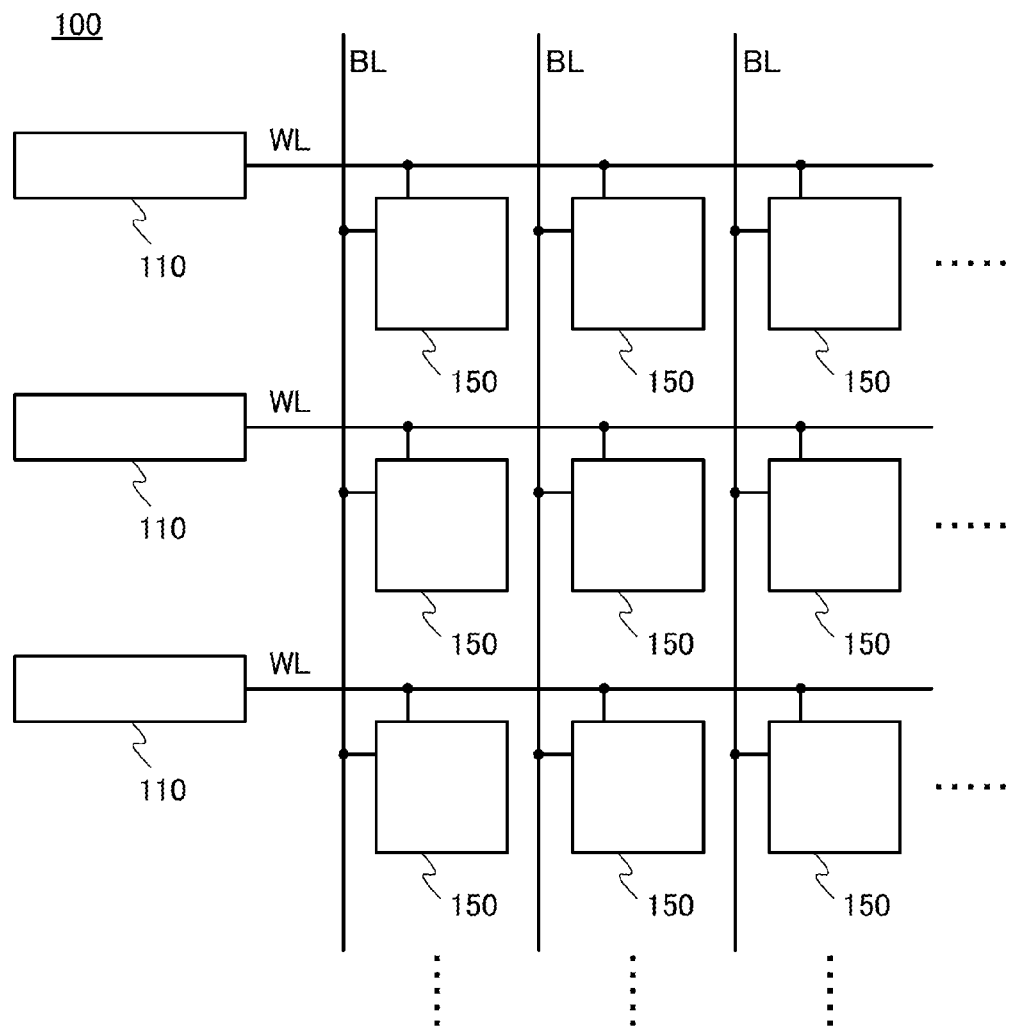
FIG. 1 is a block diagram illustrating an example of a storage device according to one embodiment of the present invention.

Embodiments of the present invention will be described in detail with reference to the drawings. Note that the present invention is not limited to the following description, and it will be readily appreciated by those skilled in the art that modes and details of the present invention can be modified in various ways without departing from the spirit and scope of the present invention. The present invention therefore should not be construed as being limited to the following description of the embodiments. Note that in structures of the present invention described below, the same portions or portions having similar functions are denoted by the same reference numerals in different drawings, and a description thereof is not repeated.

Note that in each drawing described in this specification, the size, film thickness, or region of each component is exaggerated for clarity in some cases. Thus, the scale of each component is not necessarily limited to that illustrated in the drawing.

Embodiment 1

In this embodiment, a storage device according to one embodiment of the present invention is described with reference to FIG. 1, FIGS. 2A and 2B, and FIGS. 3A and 3B.

FIG. 1 illustrates an example of a storage device 100 including a plurality of write circuits 110 and a plurality of storage elements 150. The write circuit 110 is electrically connected to the storage element 150 through a word line WL. In addition, the storage element 150 is electrically connected to a bit line BL.

One write circuit 110 may be provided for one storage element 150. Alternatively, as illustrated in FIG. 1, one write circuit may be provided for a plurality of storage elements. When one write circuit is provided for a plurality of storage elements, the area of the storage device can be reduced.

A transistor used in the storage element 150 preferably includes an oxide semiconductor film. Further, a transistor used in the write circuit 110 preferably includes single crystal silicon, which has high electron field-effect mobility; however, the write circuit 110 may partly include a transistor including an oxide semiconductor film. The transistor including an oxide semiconductor film can be stacked, for example, over an element layer formed using the transistor including single crystal silicon. Thus, the storage device can be downsized.

In the storage device 100 in FIG. 1, the storage elements 150 are arranged in matrix; however, the present invention is not limited thereto. The arrangement of the storage elements 150 may be changed when needed.

Figure 2A:
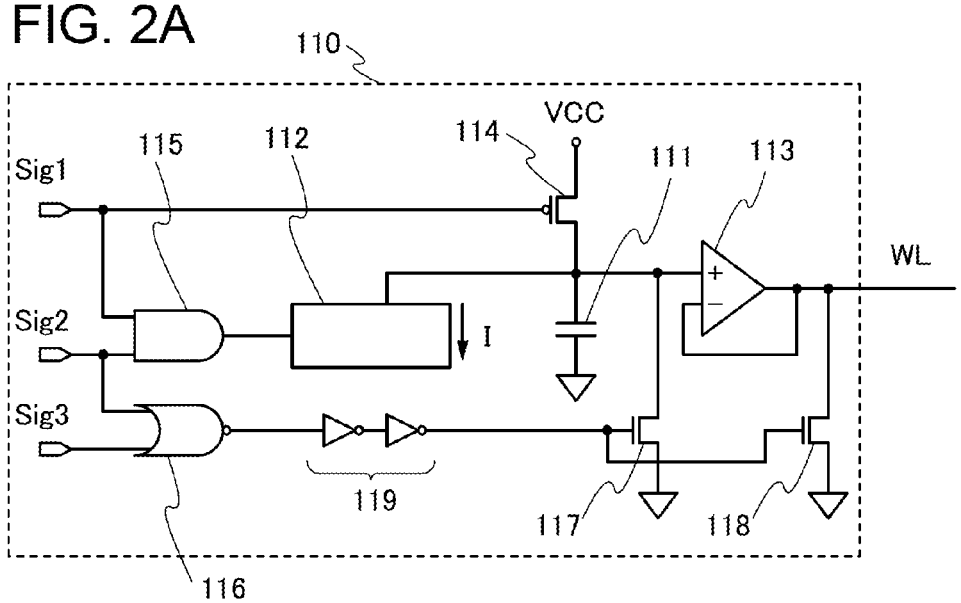
FIGS. 2A and 2B are circuit diagrams each illustrating an example of a write circuit according to one embodiment of the present invention.

The write circuit 110 can have, for example, a circuit structure illustrated in FIG. 2A. The write circuit 110 includes an element holding write voltage and a circuit gradually decreasing voltage held in the element holding write voltage. The element holding write voltage may be, for example, a storage capacitor 111. The circuit gradually decreasing voltage may be, for example, a constant current circuit 112.

As illustrated in FIG. 2A, the write circuit 110 includes a write voltage VCC terminal, a first transistor 114, the storage capacitor 111, the constant current circuit 112, an AND circuit 115, a NOR circuit 116, a buffer 119, an operational amplifier (also referred to as a voltage follower) 113, a second transistor 117, a third transistor 118, a first signal line Sig1, a second signal line Sig2, a third signal line Sig3, and the word line WL.

Each of the first transistor 114, the second transistor 117, and the third transistor 118 may be any switch that controls conduction and non-conduction, and may be an element other than the transistor. Each of the AND circuit 115 and the NOR circuit 116 is a circuit for controlling timing of circuit operation, and may be another logic circuit. The buffer 119 is not necessarily provided when the drive capability of the second transistor 117 and the third transistor 118 is low (for example, when the channel width is small).

In the write circuit 110 in FIG. 2A, the write voltage VCC terminal is connected to one of a source and a drain of the first transistor 114; a gate of the first transistor 114 is connected to the first signal line Sig1 and an input terminal of the AND circuit 115; the other of the source and the drain of the first transistor 114 is connected to the constant current circuit 112, the storage capacitor 111, a plus terminal of the operational amplifier 113, and one of a source and a drain of the second transistor 117; the other of the source and the drain of the second transistor 117 is connected to a ground; the second signal line Sig2 is connected to the input terminal of the AND circuit 115 and an input terminal of the NOR circuit 116; an output terminal of the AND circuit 115 is connected to the constant current circuit 112; the third signal line Sig3 is connected to the input terminal of the NOR circuit 116; an output terminal of the NOR circuit 116 is connected to a gate of the second transistor 117 and a gate of the third transistor 118 through the buffer 119; an output terminal of the operational amplifier 113 is connected to a minus terminal of the operational amplifier 113, one of a source and a drain of the third transistor 118, and the word line WL; and the other of the source and the drain of the third transistor 118 is connected to the ground.

Figure 2B:
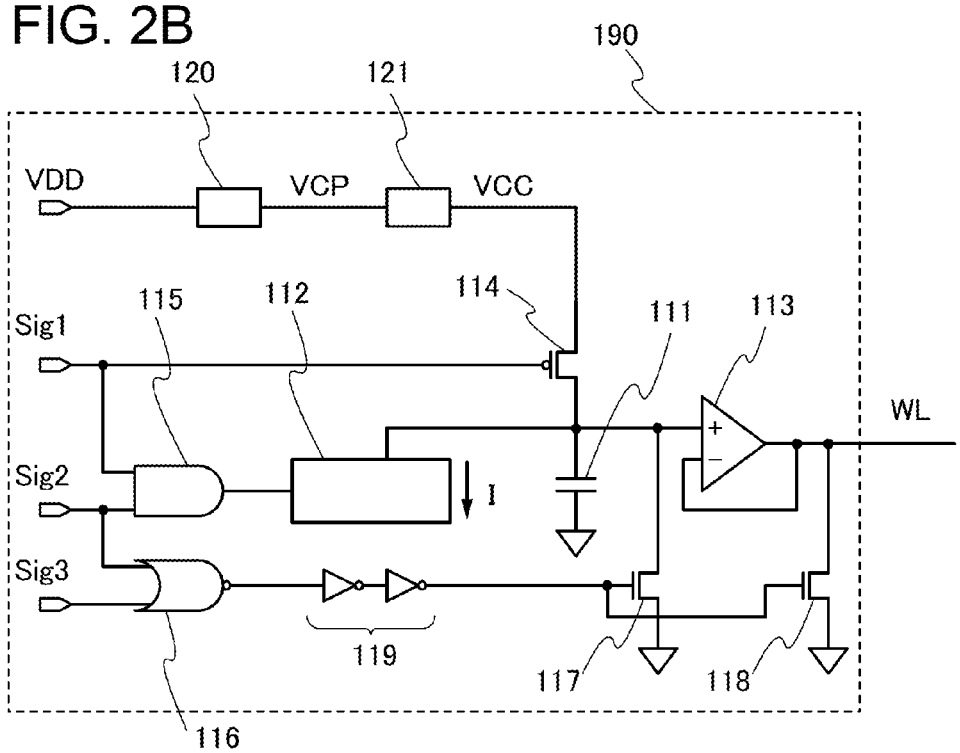

Further, as illustrated in FIG. 2A, write voltage VCC generated by stepping up power supply voltage VDD may be input to the write circuit 110. Alternatively, as illustrated in FIG. 2B, the power supply voltage VDD may be stepped up in a write circuit 190 to generate the write voltage VCC. In that case, a circuit for stepping up the power supply voltage VDD, such as a charge pump 120 or a regulator 121, may be provided in the write circuit 190.

Figure 3A:
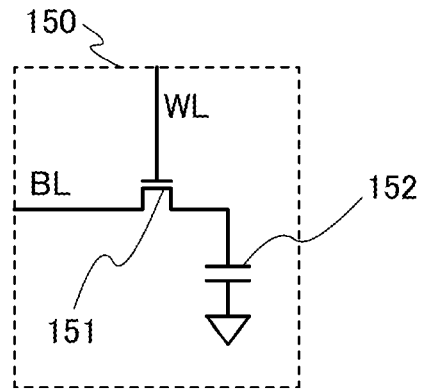
FIGS. 3A and 3B are circuit diagrams each illustrating an example of a storage element according to one embodiment of the present invention.

The storage element 150 can have, for example, a DRAM-like structure illustrated in FIG. 3A. In other words, the storage element 150 includes a write transistor 151 for writing data and a capacitor 152 retaining data.

A gate of the write transistor 151 is connected to the word line WL, and the word line WL is connected to the output terminal of the operational amplifier 113 in the write circuit 110. One of a source and a drain of the write transistor 151 is connected to the bit line BL. The other of the source and the drain of the write transistor 151 is connected to one electrode of the capacitor 152. The other electrode of the capacitor 152 is connected to the ground.

The write transistor 151 preferably includes an oxide semiconductor film. In other words, the use of an oxide semiconductor film in a channel formation region of the write transistor 151 can achieve a transistor having low off-state current. Thus, voltage written to the capacitor 152 can be prevented from decreasing due to the off-state leakage current of the write transistor 151. In general, a DRAM is a volatile storage device; however, when the write transistor 151 includes an oxide semiconductor film, the storage device can be a nonvolatile storage device.

Figure 3B:
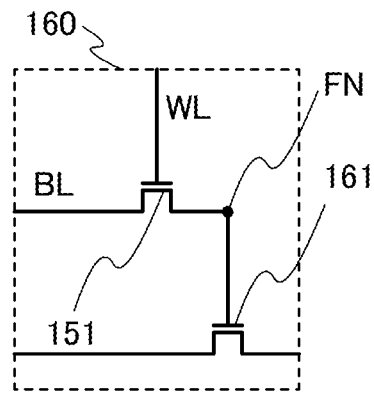

Further, as illustrated in a storage element 160 in FIG. 3B, a gain cell memory-like structure may be employed. In other words, the storage element 160 includes the write transistor 151 for writing data and a read transistor 161.

The gate of the write transistor 151 is connected to the word line WL, and the word line WL is connected to the output terminal of the operational amplifier 113 in the write circuit 110. One of the source and the drain of the write transistor 151 is connected to the bit line BL. The other of the source and the drain of the write transistor 151 is connected to a gate of the read transistor 161, so that a floating node FN is formed.

The write transistor 151 preferably includes an oxide semiconductor film. In other words, the use of an oxide semiconductor film in the channel formation region of the write transistor 151 can achieve a transistor having low off-state current. Thus, voltage written to the floating node FN can be prevented from decreasing due to the off-state leakage current of the write transistor 151. In general, a gain cell memory is a volatile storage device; however, when the write transistor 151 includes an oxide semiconductor film, the storage device can be a nonvolatile storage device.

With the above structure, in the storage device in this embodiment, held voltage can be prevented from decreasing due to feedthrough in writing data at high voltage.

<Writing Operation of Storage Device>

Operation of writing data to the storage element 150 with the use of the write circuit 110 in the storage device 100 in this embodiment is described with reference to FIG. 4, FIG. 5, FIG. 6, FIG. 7, and FIG. 8.

Figure 4:
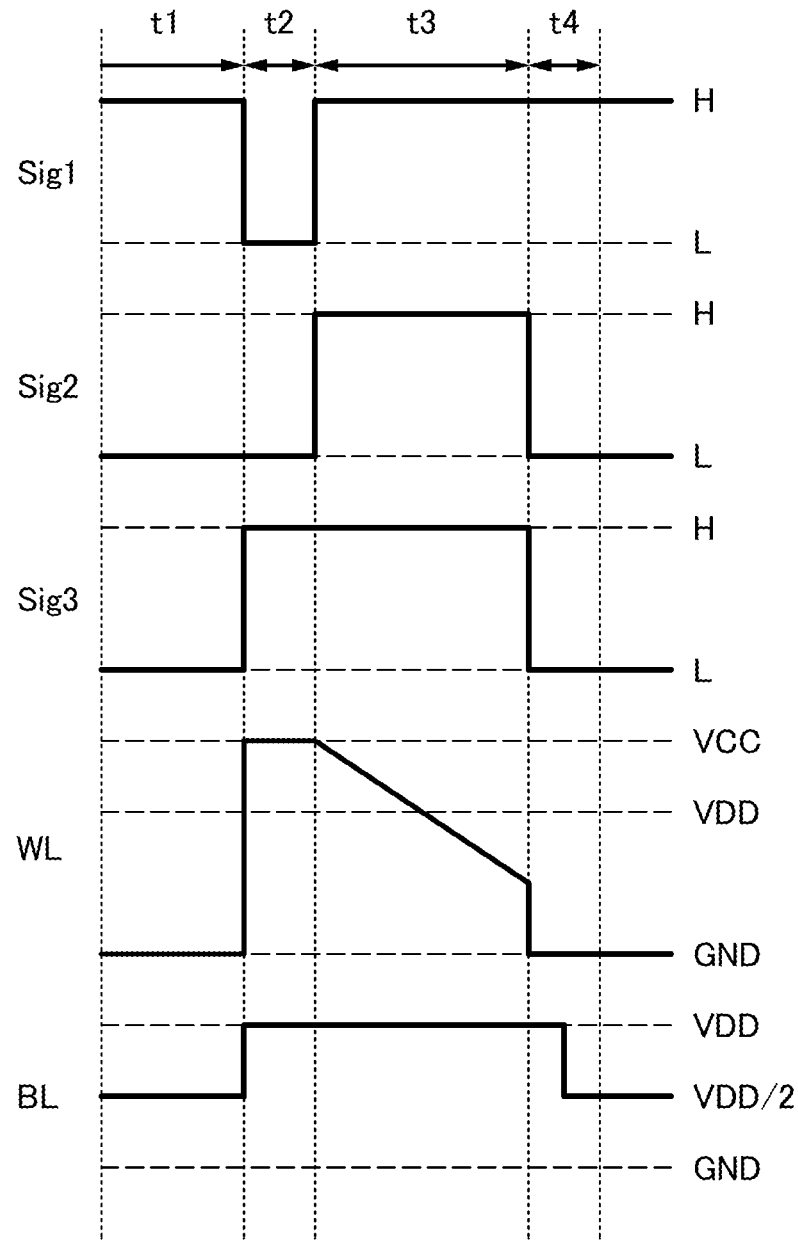
FIG. 4 is a timing chart of a storage device according to one embodiment of the present invention.

FIG. 4 is a timing chart of write operation in the storage device 100. In the write operation, information in the storage element 150 is rewritten from 0 to 1, that is, rewritten from L (Low) to H (High). FIG. 4 is a timing chart showing changes in voltage supplied to the first signal line Sig1, the second signal line Sig2, the third signal line Sig3, the word line WL, and the bit line BL. Further, in the timing chart shown in FIG. 4, a write operation period is divided into periods t1, t2, t3, and t4.

Note that in the timing chart shown in FIG. 4, for example, voltage of a High (H) signal may be VDD and voltage of a Low (L) signal may be a ground (GND). In addition, VCC may be higher than VDD.

Figure 5:
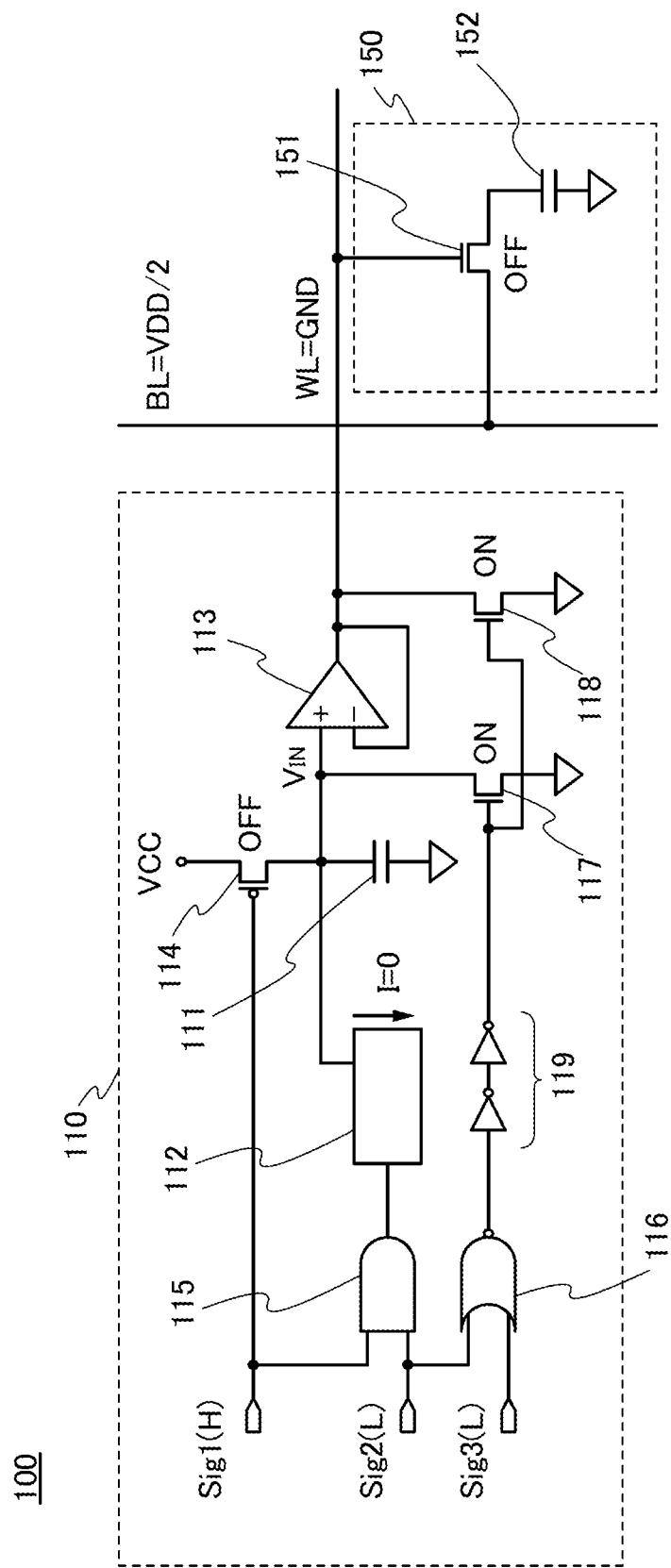
FIG. 5 is a circuit diagram of the storage device according to one embodiment of the present invention.

First, the period t1 is described. FIG. 5 illustrates the state of the storage device 100 in the period t1. As shown in FIG. 4, in the period t1, H, L, and L are input to Sig1, Sig2, and Sig3, respectively. At this time, H is input to the gate of the first transistor (p-channel transistor) 114, so that the transistor 114 is turned off (brought out of conduction). Since H and L are input to Sig1 and Sig2, respectively, a signal input to the constant current circuit 112 is L. Thus, the constant current circuit 112 is set in an off state, so that current does not flow. Since L is input to each of Sig2 and Sig3, an output of the buffer 119 is H. Since H is input to the gate of the second transistor (n-channel transistor) 117 and a gate of the third transistor (n-channel transistor) 118, the second transistor 117 and the third transistor 118 are turned on (brought into conduction). Since the second transistor 117 is on, an input $V_{IN}$ of the operational amplifier 113 is fixed to the ground (GND). Accordingly, the voltage of the word line WL connected to an output of the operational amplifier 113 is the same as the input $V_{IN}$ of the operational amplifier 113. Further, since the third transistor 118 is on, the voltage of the word line is also GND. Since the word line is not selected (is equal to GND), that is, is not in the write operation period, the voltage of the bit line BL is half of VDD. In this manner, in periods other than the write operation period, the bit line is precharged to half of VDD. Further, since the voltage of the word line is GND, the write transistor 151 is off and L is held in the capacitor 152.

Figure 6:
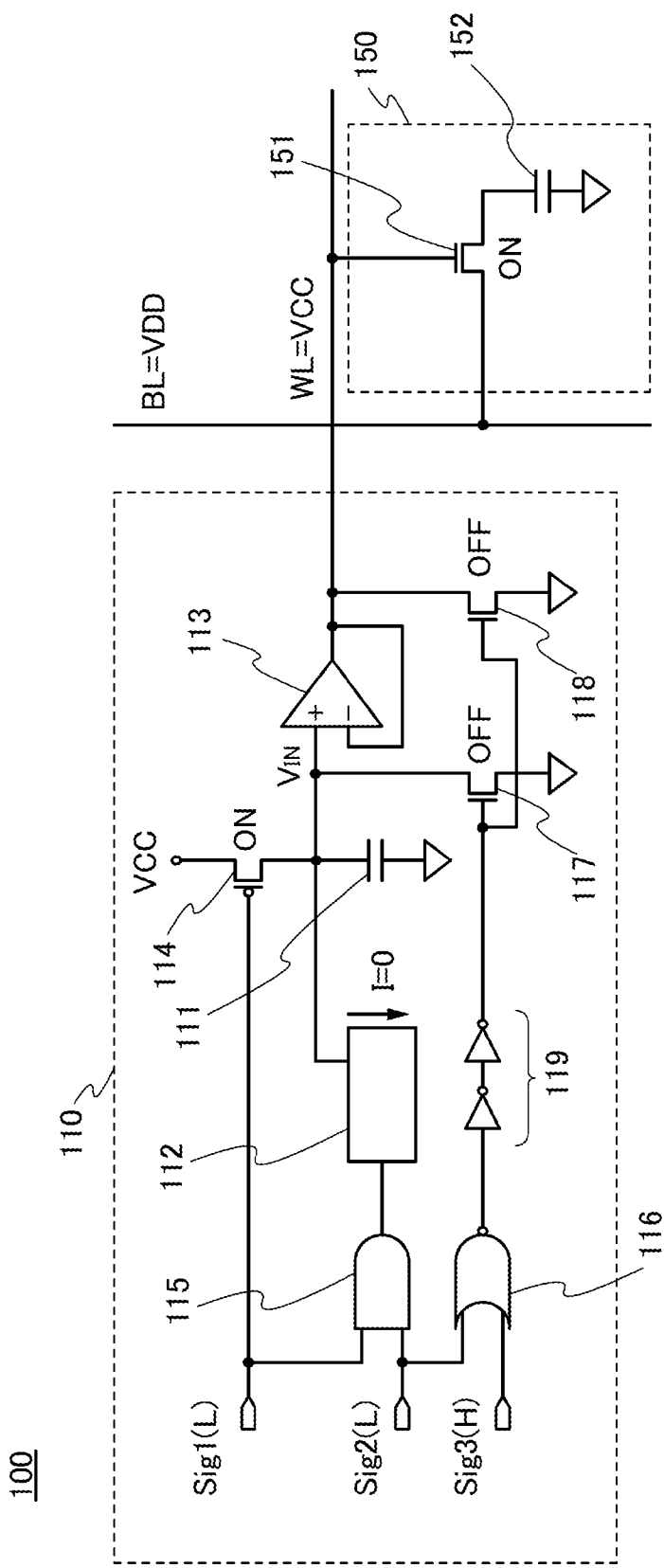
FIG. 6 is a circuit diagram of the storage device according to one embodiment of the present invention.

Next, the period t2 is described. FIG. 6 illustrates the state of the storage device 100 in the period t2. As shown in FIG. 4, in the period t2, L, L, and H are input to Sig1, Sig2, and Sig3, respectively. At this time, L is input to the gate of the first transistor (p-channel transistor) 114, so that the transistor 114 is turned on. Thus, the storage capacitor 111 is charged to VCC. Since L is input to each of Sig1 and Sig2, a signal input to the constant current circuit 112 is L. Thus, the constant current circuit 112 is set in an off state, so that current does not flow. Since L and H are input to Sig2 and Sig3, respectively, an output of the buffer 119 is L. Since L is input to the gates of the second transistor 117 and the third transistor 118 (n-channel transistors), the second transistor 117 and the third transistor 118 are turned off. Thus, the input of the operational amplifier 113 is changed from GND into VCC. The voltage of the word line WL connected to the output of the operational amplifier 113 is the same as the input $V_{IN}$ of the operational amplifier 113. Further, since the third transistor 118 is off, the voltage of the word line is also VCC. The voltage of the bit line BL is equal to the write voltage VDD. Further, since the voltage of the word line is VCC, the write transistor 151 is turned on. Thus, the capacitor 152 is charged and the voltage held in the capacitor 152 is changed from L (GND) into H (VDD). Note that for example, when the voltage VCC of the word line is sufficiently high and the capacitor 152 can be charged instantaneously, the period t2 is not necessarily provided.

Figure 7:
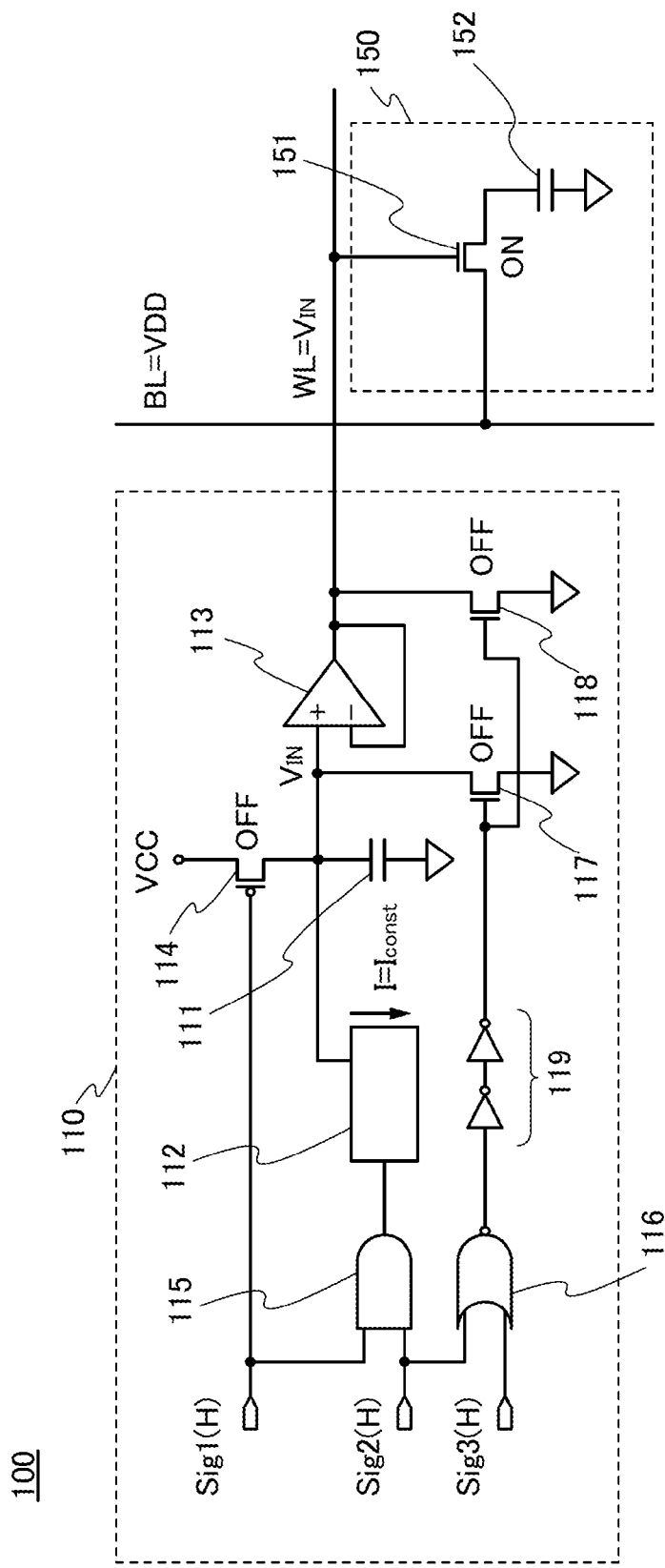
FIG. 7 is a circuit diagram of the storage device according to one embodiment of the present invention.

Next, the period t3 is described. FIG. 7 illustrates the state of the storage device 100 in the period t3. As shown in FIG. 4, in the period t3, H is input to each of Sig1, Sig2, and Sig3. At this time, H is input to the gate of the first transistor (p-channel transistor) 114, so that the transistor 114 is turned off. Since H is input to each of Sig1 and Sig2, a signal input to the constant current circuit 112 is H. Thus, the constant current circuit 112 is set in an on state, so that constant current $I_{const}$ flows through the constant current circuit 112. Accordingly, discharge of the voltage VCC held in the storage capacitor 111 is started. Since H is input to each of Sig2 and Sig3, the output of the buffer 119 is L. Since L is input to the gates of the second transistor 117 and the third transistor 118 (n-channel transistors), the second transistor 117 and the third transistor 118 are turned off. The input $V_{IN}$ of the operational amplifier 113 and VCC held in the storage capacitor 111 are discharged when the current $I_{const}$ flows through the constant current circuit 112. Thus, the input $V_{IN}$ of the operational amplifier 113 is expressed as $V_{IN}=VCC-(I_{const}\times T/C)$, where T represents time in which the constant current flows and C represents the capacitance of the storage capacitor 111. The voltage of the word line WL connected to the output of the operational amplifier 113 is the same as the input $V_{IN}$ of the operational amplifier 113. Further, since the third transistor 118 is off, the voltage of the word line is also $V_{IN}$. In other words, the voltage of the word line is gradually decreased from VCC. Although the voltage of the word line is gradually decreased from VCC, the write transistor 151 is kept on while the voltage of the word line is higher than the threshold voltage Vth of the write transistor 151. When the voltage of the word line is lower than the threshold voltage, almost no current flows through the write transistor 151, so that the write transistor 151 is turned off. The voltage of the bit line BL is equal to the write voltage VDD. In addition, the voltage held in the capacitor 152 remains H (VDD).

Figure 8:
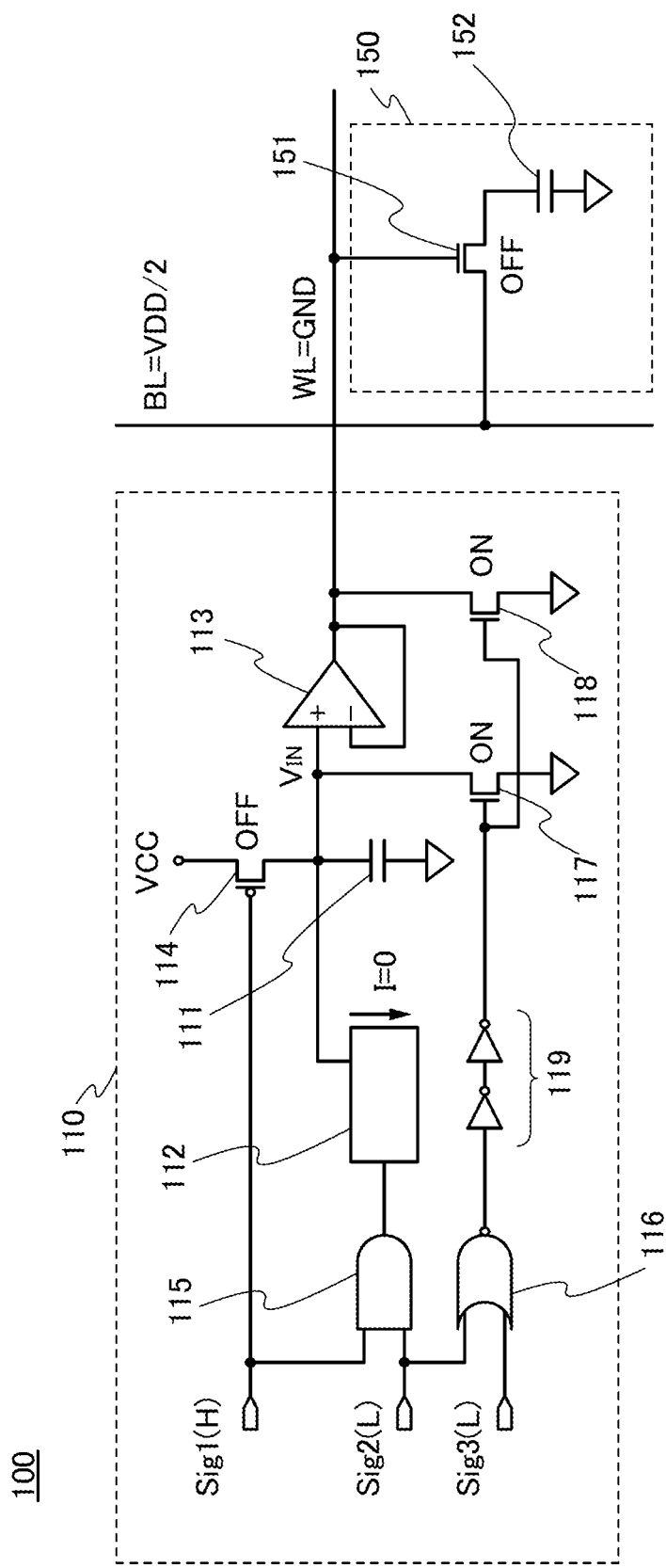
FIG. 8 is a circuit diagram of the storage device according to one embodiment of the present invention.

Next, the period t4 is described. FIG. 8 illustrates the state of the storage device 100 in the period t4. As shown in FIG. 4, in the period t4, H, L, and L are input to Sig1, Sig2, and Sig3, respectively. At this time, H is input to the gate of the first transistor (p-channel transistor) 114, so that the transistor 114 is turned off. Since H and L are input to Sig1 and Sig2, respectively, a signal input to the constant current circuit 112 is L. Thus, the constant current circuit 112 is set in an off state, so that current does not flow through the constant current circuit 112. Accordingly, the discharge from the storage capacitor 111 is stopped. Since L is input to each of Sig2 and Sig3, the output of the buffer 119 is H. Since H is input to the gates of the second transistor 117 and the third transistor 118 (n-channel transistors), the second transistor 117 and the third transistor 118 are turned on. Thus, the input $V_{IN}$ and output voltage of the operational amplifier 113 are discharged to GND without stopping. Accordingly, the voltage of the word line is also GND. The write transistor 151 is off, and the voltage held in the capacitor 152 remains H (VDD). After the write transistor 151 is completely turned off, the voltage of the bit line BL is half of VDD and the write operation is terminated.

Next, a calculation result of changes in voltage held in a capacitor in an example where data is written to a storage element by a writing method of a storage device according to one embodiment of the present invention is shown. Note that a calculation result of changes in voltage held in a capacitor in an example where data is written to a storage element without the use of a write circuit according to one embodiment of the present invention is shown as a comparison example.

Figure 9A:
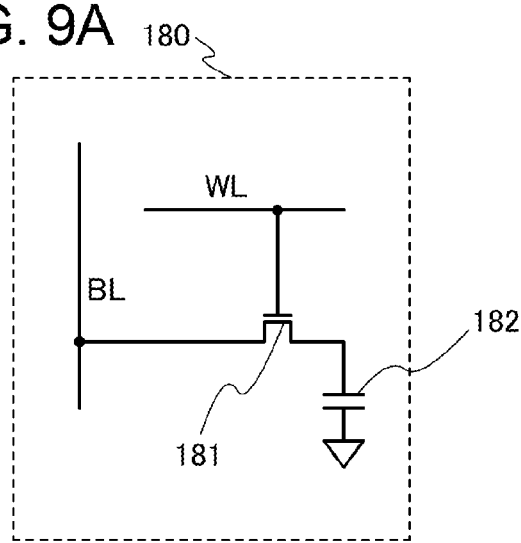
FIGS. 9A to 9C show voltage drop due to feedthrough in writing methods.

FIG. 9A is a circuit diagram of a storage element 180 to which data is written in the comparison example. The storage element 180 includes a write transistor 181 and a capacitor 182. A gate of the write transistor 181 is connected to the word line WL. One of a source and a drain of the write transistor 181 is connected to the bit line BL. The other of the source and the drain of the write transistor 181 is connected to the capacitor 182. The write transistor 181 may be similar to the write transistor 151 in the storage element 150 described in this embodiment, and the capacitor 182 may be similar to the capacitor 152 in the storage element 150 described in this embodiment.

The storage element 150 differs from the storage element 180 only in that in writing data to the storage element 150, the voltage of the word line WL that is input to the gate of the write transistor 151 is adjusted using the write circuit 110, while in writing data to the storage element 180, power supply voltage is directly input as the voltage of the word line WL that is input to the gate of the write transistor 181.

Figure 9B:
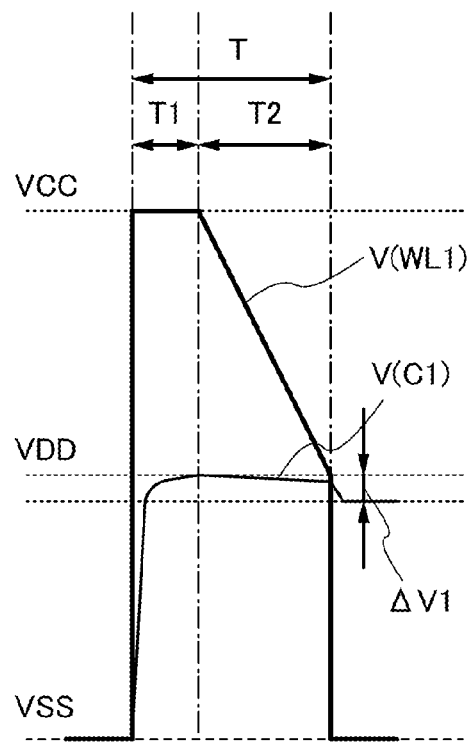

Next, FIG. 9B shows a calculation result of changes in voltage of a word line and voltage held in a capacitor in the writing method of the storage device according to one embodiment of the present invention. Further, FIG. 9C shows a calculation result of changes in voltage of a word line and voltage held in a capacitor in the writing method of the storage device according to the comparison example.

Figure 9C:
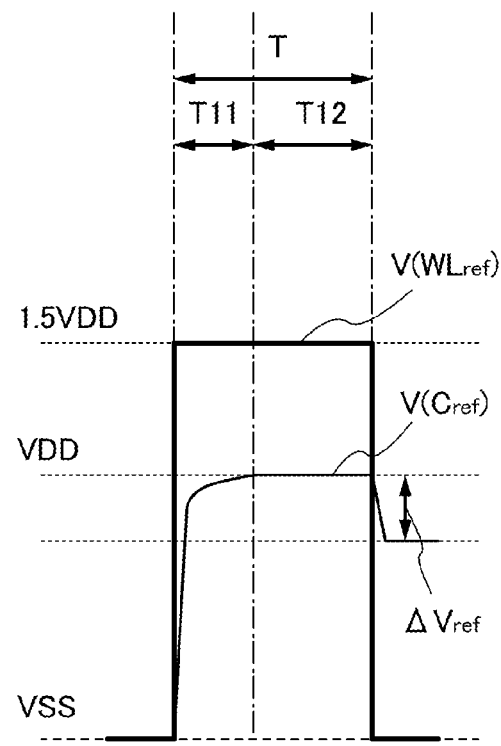

In each of FIGS. 9B and 9C, the horizontal axis and the vertical axis represent time and voltage, respectively. In a data write time T, time to stabilize voltage held in the capacitor 152 according to one embodiment of the present invention at VDD is denoted by T1, and time to terminate the following writing is denoted by T2. Similarly, in the data write time T, time to stabilize voltage held in the capacitor 182 according to the comparison example at VDD is denoted by T11, and time to terminate the following writing is denoted by T12.

In the write operation according to one embodiment of the present invention, the voltage of the word line is denoted by V(WL1), and the voltage held in the capacitor 152 is denoted by V(C1). The amount of voltage drop due to feedthrough that is generated by setting the voltage of the word line at VSS after the writing is terminated is denoted by $\Delta V1$. In the write operation according to the comparison example, the voltage of the word line is denoted by $V(WL_{ref})$, and the voltage held in the capacitor 182 is denoted by $V(C_{ref})$. The amount of voltage drop due to feedthrough that is generated by setting the voltage of the word line at VSS after the writing is terminated is denoted by $\Delta V_{ref}$.

The calculation results in FIGS. 9B and 9C show that the amount of voltage drop $\Delta V$ due to the feedthrough in the writing method according to one embodiment of the present invention is smaller than that in the writing method according to the comparison example.

The amount of voltage drop $\Delta V$ due to the feedthrough is expressed by the capacitance (Cs) of the capacitor, the parasitic capacitance (Cp) of the write transistor, and the amount of write voltage drop, that is, the amount of voltage drop $(V_{max}-V_{min})$ of the word line. The amount of voltage drop $\Delta V$ due to the feedthrough is expressed as $\Delta V=(V_{max}-V_{min}) \times (Cp/Cp+Cs)$. This indicates that as the amount of voltage drop $(V_{max}-V_{min})$ of the word line becomes larger, the amount of voltage drop $\Delta V$ due to the feedthrough becomes larger. Thus, it might be unable to detect data when the data is to be read.

As illustrated in FIGS. 9B and 9C, in the writing method according to one embodiment of the present invention, the amount of voltage drop $(V_{max}-V_{min})$ of the word line is substantially made up of the amount of voltage drop (VDD−VSS). However, in the writing method according to the comparison example, the amount of voltage drop $(V_{max}-V_{min})$ of the word line is made up of the amount of voltage drop (1.5VDD−VSS). Accordingly, the use of the writing method according to one embodiment of the present invention can reduce the amount of voltage drop $\Delta V$ due to the feedthrough.

From the above, even in the case where the write speed is increased using high voltage as the voltage of a word line at the start of writing, the use of the writing method according to one embodiment of the present invention can reduce the amount of voltage drop $\Delta V$ due to the feedthrough. In other words, in the present invention, in the period T2, the potential of the word line is continuously changed from VCC into VDD. In contrast, in the comparison example, right after the period T12, the potential of the word line is instantaneously changed from 1.5VDD into VSS. In this manner, in the present invention in which the potential of the word line is continuously changed, the amount of voltage drop can be reduced compared to the comparison example in which the potential of the word line is instantaneously changed.

By the above write operation, in one embodiment of the present invention, it is possible to achieve a writing method of a storage device in which held voltage is prevented from decreasing due to feedthrough in writing data to the storage device at high voltage.

This embodiment can be combined with any of the above embodiments as appropriate.

Embodiment 2

In this embodiment, an example of cross-sectional structures of transistors included in the storage device 100 in Embodiment 1 is described with reference to FIG. 10.

In this embodiment, a transistor 900 includes part of a semiconductor substrate 901 and a transistor 202 includes an oxide semiconductor; however, this embodiment is not limited thereto. The transistor 202 is stacked over the transistor 900; however, the stack order may be reversed and the transistors 202 and 900 may be formed over one surface. Further, the transistor 900 is connected to the transistor 202 through a wiring; however, this embodiment is not limited thereto. The transistor 900 may be connected to the transistor 202 by another method, or the transistor 900 may not be connected to the transistor 202.

For example, the first transistor 114 in Embodiment 1 may be used as the transistor 900, and the write transistor 151 may be used as the transistor 202.

The transistor 900 includes the semiconductor substrate 901, an element isolation insulating film 902 provided on the semiconductor substrate 901, a gate insulating film 904 over the semiconductor substrate 901, a gate electrode 905 over the gate insulating film 904, a source and drain regions 903 formed in regions of the semiconductor substrate 901 that do not overlap with the gate electrode 905, an interlayer insulating film 906, and a wiring 907 connected to the source and drain regions 903 through contact holes formed by processing of the interlayer insulating film.

The transistor 202 includes a base insulating film 908, an oxide semiconductor film 909 over the base insulating film 908, a source and drain electrodes 910 in contact with the oxide semiconductor film 909, a gate insulating film 911 over the oxide semiconductor film 909 and the source and drain electrodes 910, a gate electrode 912 that is over the gate insulating film 911 and overlaps with the oxide semiconductor film 909, and an interlayer insulating film 913 over the gate electrode 912 and the gate insulating film 911.

Figure 10:
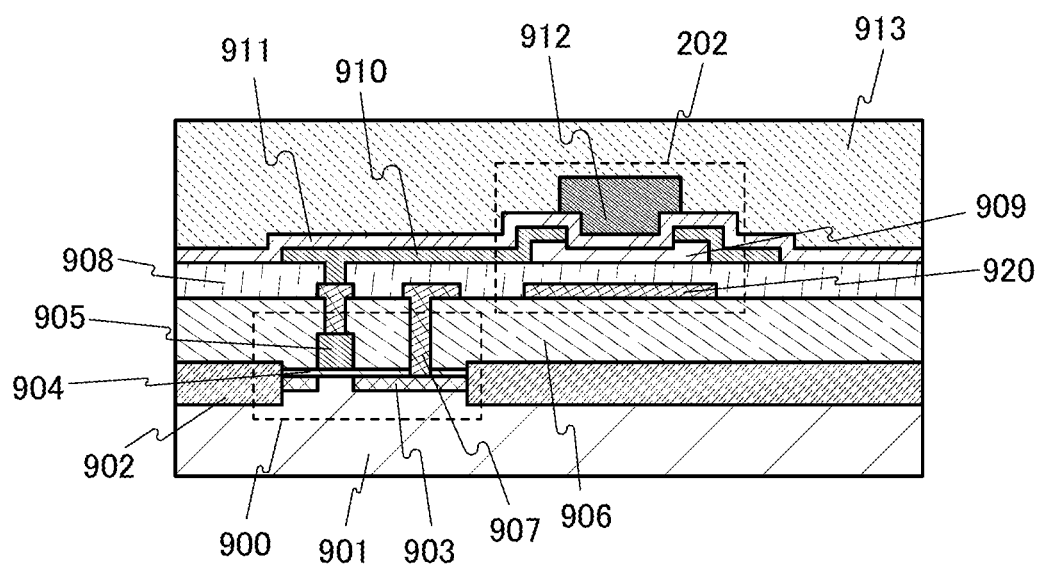
FIG. 10 is a cross-sectional view of a storage device according to one embodiment of the present invention.

As illustrated in FIG. 10, a back gate electrode 920 may be formed on a back channel side of the transistor 202 with the base insulating film 908 positioned therebetween. The back gate electrode 920 may be formed using the same layer as the wiring 907 as illustrated in FIG. 10 or may be separately provided. Provision of the back gate electrode 920 enables easy control of the threshold voltage of the transistor 202.

The transistor 202 has a top-gate structure; however, the transistor 202 may have a bottom-gate structure.

As the semiconductor substrate 901, a single crystal silicon substrate (a silicon wafer), or a compound semiconductor substrate (e.g., a SiC substrate or a GaN substrate) can be used. In this embodiment, a p-type silicon substrate is used.

Instead of the semiconductor substrate 901, the following substrate may be used as a silicon on insulator (SOI) substrate: a so-called separation by implanted oxygen (SIMOX) substrate which is formed in such a manner that after an oxygen ion is implanted into a mirror-polished wafer, an oxide layer is formed at a certain depth from a surface and defects generated in a surface layer are eliminated by high-temperature heating; or an SOI substrate formed by a technique called a Smart-Cut method in which a semiconductor substrate is cleaved by utilizing the thermally induced growth of a minute void formed by implantation of a hydrogen ion, an epitaxial layer transfer (ELTRAN: a registered trademark of Canon Inc.) method, or the like.

The element isolation insulating film 902 can be formed by local oxidation of silicon (LOCOS), shallow trench isolation (STI), or the like.

The gate insulating film 904 can be formed using a silicon oxide film obtained by heat treatment (also referred to as thermal oxidation) in an oxygen atmosphere so that a surface of the semiconductor substrate 901 is oxidized. Alternatively, the gate insulating film 904 can be formed to have a layered structure including a silicon oxide film and a silicon film containing oxygen and nitrogen (a silicon oxynitride film) by forming the silicon oxide film by thermal oxidation and then nitriding a surface of the silicon oxide film by nitriding treatment. Alternatively, the gate insulating film 904 can be formed by deposition such as plasma-enhanced CVD.

Alternatively, the gate insulating film 904 may be formed using a metal oxide such as tantalum oxide, hafnium oxide, hafnium silicate oxide, zirconium oxide, or aluminum oxide, which is a high dielectric constant material (also referred to as a high-k material), a rare-earth oxide such as lanthanum oxide, or the like by CVD, sputtering, or the like.

The gate electrode 905 can be formed using a metal selected from tantalum, tungsten, titanium, molybdenum, chromium, or niobium, or an alloy material or a compound material including any of the metals as its main component. Alternatively, polycrystalline silicon to which an impurity element such as phosphorus is added can be used. Alternatively, the gate electrode 905 may be formed to have a layered structure of a metal nitride film and a film of any of the metals. As a metal nitride, tungsten nitride, molybdenum nitride, or titanium nitride can be used. When the metal nitride film is provided, adhesion of the metal film can be increased; thus, separation can be prevented. The gate electrode 905 can be formed by sputtering or the like.

Note that sidewall insulating films may be formed on side surfaces of the gate electrode 905. Provision of the sidewall insulating films can alleviate an electric field between the source and drain electrodes of the transistor, so that the reliability of the element can be improved.

The source and drain regions 903 can be formed by addition of an impurity element imparting conductivity to the semiconductor substrate 901 with the use of the gate electrode 905 as a mask. The source and drain regions 903 can be formed in a self-aligning manner with the use of the gate electrode 905 as a mask as described above. In this embodiment, the source and drain regions 903 formed using n-type silicon may be formed by addition of phosphorus (P) imparting n-type conductivity to the p-type silicon substrate.

The interlayer insulating film 906 may be formed to have a single layer or a stack including one or more of silicon oxide, silicon oxynitride, silicon nitride oxide, silicon nitride, aluminum oxide, aluminum oxynitride, aluminum nitride oxide, aluminum nitride, and the like. Note that the interlayer insulating film 906 is formed using silicon nitride by CVD, so that a film containing a large amount of hydrogen can be formed as the interlayer insulating film 906. Heat treatment is performed using the interlayer insulating film 906, so that hydrogen can be diffused into the semiconductor substrate, terminate a dangling bond in the semiconductor substrate can be terminated by hydrogen, and defects in the semiconductor substrate can be reduced.

Alternatively, a film that inhibits diffusion of an impurity such as hydrogen is preferably used as the interlayer insulating film 906. Thus, it is possible to inhibit diffusion of an impurity such as hydrogen contained in the film of the transistor 900 into the transistor 202.

Note that the flatness of the interlayer insulating film 906 can be increased when the interlayer insulating film 906 is formed using an inorganic material such as borophosphosilicate glass (BPSG), or an organic material such as polyimide or acrylic.

The wiring 907 is formed to have a single-layer structure or a layered structure including any of metals such as aluminum, titanium, chromium, nickel, copper, yttrium, zirconium, molybdenum, silver, tantalum, and tungsten and an alloy containing any of these metals as its main component. For example, a single-layer structure of an aluminum film containing silicon, a two-layer structure in which a titanium film is stacked over an aluminum film, a two-layer structure in which a titanium film is stacked over a tungsten film, a two-layer structure in which a copper film is formed over a copper-magnesium-aluminum alloy film, and a three-layer structure in which a titanium film, an aluminum film, and a titanium film are stacked in that order can be given. Note that a transparent conductive material containing indium oxide, tin oxide, or zinc oxide may be used. The wiring 907 can be formed by sputtering or the like.

Further, the wiring 907 can function as a back gate electrode of the transistor 202.

The base insulating film 908 may be formed to have a single layer or a stack including one or more of silicon oxide, silicon oxynitride, silicon nitride oxide, silicon nitride, aluminum oxide, aluminum nitride, hafnium oxide, zirconium oxide, yttrium oxide, gallium oxide, lanthanum oxide, cesium oxide, tantalum oxide, and magnesium oxide. The base insulating film 908 can be formed by CVD, sputtering, or the like.

In addition, it is preferable that the base insulating film 908 be sufficiently flat. Specifically, the base insulating film is provided to have an average surface roughness (Ra) of 1 nm or less, preferably 0.3 nm or less, more preferably 0.1 nm or less. When Ra is less than or equal to the above value, a crystal region is easily formed in the oxide semiconductor film. Note that Ra is obtained by expanding, into three dimensions, arithmetic mean surface roughness that is defined by JIS B 0601: 2001 (ISO4287:1997) to be applicable to a curved surface. Here, Ra can be expressed as an "average value of the absolute values of deviations from a reference surface to a specific surface" and is defined by Formula 1.

$$Ra = \frac{1}{S_0} \int_{y1}^{y2} \int_{x1}^{x2} |f(x, y) - Z_0| dx dy \quad \text{Formula 1}$$

The specific surface is a surface which is a target of roughness measurement, and is a quadrilateral region which is specified by four points represented by the coordinates (x1, y1, f(x1, y1)), (x1, y2, f(x1, y2)), (x2, y1, f(x2, y1)), and (x2, y2, f(x2, y2)). Here, $S_0$ represents the area of a rectangle obtained by projecting the specific surface on the xy plane, and $Z_0$ represents the height of the reference surface (the average height of the specific surface). Note that Ra can be measured using an atomic force microscope (AFM).

Silicon oxynitride means a substance that contains more oxygen than nitrogen. For example, silicon oxynitride contains oxygen, nitrogen, silicon, and hydrogen at concentrations ranging from 50 to 70 at. %, 0.5 to 15 at. %, 25 to 35 at. %, and 0 to 10 at. %, respectively. In addition, silicon nitride oxide means a substance that contains more nitrogen than oxygen. For example, silicon nitride oxide contains oxygen, nitrogen, silicon, and hydrogen at concentrations ranging from 5 to 30 at. %, 20 to 55 at. %, 25 to 35 at. %, and 10 to 25 at. %, respectively. Note that the above ranges are obtained when measurement is performed using Rutherford backscattering spectrometry (RBS) and hydrogen forward scattering spectrometry (HFS). Further, the total percentage of the constituent elements does not exceed 100 at. %.

It is preferable to use an insulating film from which oxygen is released by heat treatment as the base insulating film 908.

To release oxygen by heat treatment means that the released amount of oxygen which is converted into oxygen atoms is $1.0 \times 10^{18}$ atoms/cm$^3$ or greater, preferably $3.0 \times 10^{20}$ atoms/cm$^3$ or greater in thermal desorption spectroscopy (TDS) analysis.

Here, a method for measuring the amount of released oxygen which is converted into oxygen atoms in TDS analysis is described below.

The amount of released gas in TDS analysis is proportional to the integral value of a spectrum. Thus, the amount of released gas can be calculated from the ratio of the integral value of a measured spectrum to the reference value of a standard sample. The reference value of a standard sample means the ratio of the density of a predetermined atom contained in a sample to the integral value of a spectrum.

For example, the amount of released oxygen molecules ($N_{O2}$) from an insulating film can be obtained by Formula 2 with the TDS analysis results of a silicon wafer containing hydrogen at predetermined density that is the standard sample and the TDS analysis results of the insulating film. Here, all the spectra having a mass number of 32 that are obtained by the TDS analysis are assumed to originate from an oxygen molecule. Note that CH$_3$OH, which is a gas having a mass number of 32, is not taken into consideration on the assumption that it is unlikely to be present. Further, an oxygen molecule including an oxygen atom having a mass number of 17 or 18 that is an isotope of an oxygen atom is not taken into consideration because the proportion of such a molecule in the natural world is minimal $$N_{O2} = \frac{N_{H2}}{S_{H2}} \times S_{O2} \times \alpha \quad \text{Formula 2}$$

Note that $N_{H2}$ is the value obtained by conversion of the number of hydrogen molecules desorbed from the standard sample into density, and $S_{H2}$ is the integral value of a spectrum in the TDS analysis of the standard sample. Here, the reference value of the standard sample is $N_{H2}/S_{H2}$, $S_{O2}$ is the integral value of a spectrum in the TDS analysis of the insulating film, and α is a coefficient affecting the intensity of the spectrum in the TDS analysis. Refer to Japanese Published Patent Application No. 6-275697 for details of Formula 2. Note that the amount of released oxygen from the insulating film is measured with a thermal desorption spectroscopy apparatus produced by ESCO Ltd., EMD-WA1000S/W using a silicon wafer containing a hydrogen atom at $1 \times 10^{16}$ atoms/cm$^2$ as the standard sample.

Further, in the TDS analysis, part of oxygen is detected as an oxygen atom. The ratio of oxygen molecules to oxygen atoms can be calculated from the ionization rate of the oxygen molecules. Note that since α includes the ionization rate of the oxygen molecules, the amount of released oxygen atoms can also be estimated through evaluation of the amount of released oxygen molecules.

Note that $N_{O2}$ is the amount of released oxygen molecules. The amount of released oxygen which is converted into oxygen atoms is twice the amount of released oxygen molecules.

In the transistor including an oxide semiconductor film, supply of oxygen from the base insulating film to the oxide semiconductor film can reduce interface state density between the oxide semiconductor film and the base insulating film. As a result, carrier trapping at an interface between the oxide semiconductor film and the base insulating film due to the operation of a transistor, or the like can be inhibited. Thus, the transistor can have high reliability.

Further, in some cases, electric charge is generated due to oxygen vacancy in the oxide semiconductor film. In general, part of oxygen vacancy in an oxide semiconductor film serves as a donor and causes release of an electron that is a carrier. As a result, the threshold voltage of a transistor shifts in a negative direction. When oxygen is sufficiently supplied from the base insulating film to the oxide semiconductor film and the oxide semiconductor film preferably contains oxygen excessively, the density of oxygen vacancies in the oxide semiconductor film, which causes the negative shift of the threshold voltage, can be reduced.

A material used for the oxide semiconductor film 909 preferably contains at least indium (In) or zinc (Zn). In particular, the oxide semiconductor film 909 preferably contains In and Zn. As a stabilizer for reducing variations in electrical characteristics of a transistor including the oxide semiconductor film 909, gallium (Ga) is preferably contained in addition to In and Zn. Tin (Sn), hafnium (Hf), aluminum (Al), titanium (Ti), or zirconium (Zr) is preferably contained as a stabilizer.

As another stabilizer, one or more kinds of lanthanoid such as lanthanum (La), cerium (Ce), praseodymium (Pr), neodymium (Nd), samarium (Sm), europium (Eu), gadolinium (Gd), terbium (Tb), dysprosium (Dy), holmium (Ho), erbium (Er), thulium (Tm), ytterbium (Yb), or lutetium (Lu) may be contained.

For example, indium oxide, gallium oxide, tin oxide, zinc oxide, an In—Zn-based oxide, a Sn—Zn-based oxide, an Al—Zn-based oxide, a Zn—Mg-based oxide, a Sn—Mg-based oxide, an In—Mg-based oxide, an In—Ga-based oxide, an In—Ga—Zn-based oxide (also referred to as IGZO), an In—Al—Zn-based oxide, an In—Sn—Zn-based oxide, a Sn—Ga—Zn-based oxide, an Al—Ga—Zn-based oxide, a Sn—Al—Zn-based oxide, an In—Hf—Zn-based oxide, an In—La—Zn-based oxide, an In—Ce—Zn-based oxide, an In—Pr—Zn-based oxide, an In—Nd—Zn-based oxide, an In—Sm—Zn-based oxide, an In—Eu—Zn-based oxide, an In—Gd—Zn-based oxide, an In—Tb—Zn-based oxide, an In—Dy—Zn-based oxide, an In—Ho—Zn-based oxide, an In—Er—Zn—based oxide, an In—Tm—Zn-based oxide, an In—Yb—Zn-based oxide, an In—Lu—Zn-based oxide, an In—Sn—Ga—Zn-based oxide, an In—Hf—Ga—Zn-based oxide, an In—Al—Ga—Zn-based oxide, an In—Sn—Al—Zn-based oxide, an In—Sn—Hf—Zn-based oxide, or an In—Hf—Al—Zn-based oxide can be used as an oxide semiconductor.

A CAAC-OS film is described below.

The CAAC-OS film is one of oxide semiconductor films including a plurality of crystal parts, and most of the crystal parts each fit into a cube whose one side is less than 100 nm. Thus, there is a case where a crystal part included in the CAAC-OS film fits into a cube whose one side is less than 10 nm, less than 5 nm, or less than 3 nm.

In a transmission electron microscope (TEM) image of the CAAC-OS film, a boundary between crystal parts, that is, a grain boundary is not clearly observed. Thus, in the CAAC-OS film, a reduction in electron mobility due to the grain boundary is less likely to occur.

According to the TEM image of the CAAC-OS film observed in a direction substantially parallel to a sample surface (cross-sectional TEM image), metal atoms are arranged in a layered manner in the crystal parts. Each metal atom layer has a morphology reflected by a surface over which the CAAC-OS film is formed (hereinafter, a surface over which the CAAC-OS film is formed is referred to as a formation surface) or a top surface of the CAAC-OS film, and is arranged in parallel to the formation surface or the top surface of the CAAC-OS film.

On the other hand, according to the TEM image of the CAAC-OS film observed in a direction substantially perpendicular to the sample surface (planar TEM image), metal atoms are arranged in a triangular or hexagonal configuration in the crystal parts. However, there is no regularity of arrangement of metal atoms between different crystal parts.

From the results of the cross-sectional TEM image and the planar TEM image, alignment is found in the crystal parts in the CAAC-OS film.

A CAAC-OS film is subjected to structural analysis with an X-ray diffraction (XRD) apparatus. For example, when the CAAC-OS film including an $InGaZnO_4$ crystal is analyzed by an out-of-plane method, a peak appears frequently when the diffraction angle ($2\theta$) is around $31°$. This peak is derived from the (009) plane of the $InGaZnO_4$ crystal, which indicates that crystals in the CAAC-OS film have c-axis alignment, and that the c-axes are aligned in a direction substantially perpendicular to the formation surface or the top surface of the CAAC-OS film.

On the other hand, when the CAAC-OS film is analyzed by an in-plane method in which an X-ray enters a sample in a direction perpendicular to the c-axis, a peak appears frequently when $2\theta$ is around $56°$. This peak is derived from the (110) plane of the $InGaZnO_4$ crystal. Here, analysis ($\phi$ scan) is performed under conditions where the sample is rotated around a normal vector of a sample surface as an axis ($\phi$ axis) with $2\theta$ fixed at around $56°$. In the case where the sample is a single-crystal oxide semiconductor film of $InGaZnO_4$, six peaks appear. The six peaks are derived from crystal planes equivalent to the (110) plane. On the other hand, in the case of a CAAC-OS film, a peak is not clearly observed even when $\phi$ scan is performed with $2\theta$ fixed at around $56°$.

According to the above results, in the CAAC-OS film having c-axis alignment, while the directions of a-axes and b-axes are different between crystal parts, the c-axes are aligned in a direction parallel to a normal vector of a formation surface or a normal vector of a top surface. Thus, each metal atom layer which is arranged in a layered manner and observed in the cross-sectional TEM image corresponds to a plane parallel to the a-b plane of the crystal.

Note that the crystal part is formed concurrently with deposition of the CAAC-OS film or is formed through crystallization treatment such as heat treatment. As described above, the c-axis of the crystal is aligned in a direction parallel to a normal vector of a formation surface or a normal vector of a top surface. Thus, for example, in the case where the shape of the CAAC-OS film is changed by etching or the like, the c-axis might not be necessarily parallel to a normal vector of a formation surface or a normal vector of a top surface of the CAAC-OS film.

Further, the crystallinity in the CAAC-OS film is not necessarily uniform. For example, in the case where crystal growth leading to the CAAC-OS film occurs from the vicinity of the top surface of the film, the crystallinity in the vicinity of the top surface is higher than that in the vicinity of the formation surface in some cases. Further, when an impurity is added to the CAAC-OS film, the crystallinity in a region to which the impurity is added is changed, and the crystallinity in the CAAC-OS film varies depending on regions.

Note that when the CAAC-OS film with an InGaZnO$_4$ crystal is analyzed by an out-of-plane method, a peak of 2θ may also be observed at around 36°, in addition to the peak of 2θ at around 31°. The peak of 2θ at around 36° indicates that a crystal having no c-axis alignment is included in part of the CAAC-OS film. It is preferable that in the CAAC-OS film, a peak of 2θ appear at around 31° and a peak of 2θ do not appear at around 36°.

The CAAC-OS film is an oxide semiconductor film having low impurity concentration. The impurity is an element other than the main components of the oxide semiconductor film, such as hydrogen, carbon, silicon, or a transition metal element. In particular, an element that has higher bonding strength to oxygen than a metal element included in the oxide semiconductor film, such as silicon, disturbs the atomic arrangement of the oxide semiconductor film by depriving the oxide semiconductor film of oxygen and causes a decrease in crystallinity. Further, a heavy metal such as iron or nickel, argon, carbon dioxide, or the like has a large atomic radius (molecular radius), and thus disturbs the atomic arrangement of the oxide semiconductor film and causes a decrease in crystallinity when it is contained in the oxide semiconductor film. Note that the impurity contained in the oxide semiconductor film might serve as a carrier trap or a carrier generation source.

The CAAC-OS film is an oxide semiconductor film having a low density of defect states. In some cases, oxygen vacancies in the oxide semiconductor film serve as carrier traps or serve as carrier generation sources when hydrogen is captured therein.

The state in which impurity concentration is low and density of defect states is low (the number of oxygen vacancies is small) is referred to as a "highly purified intrinsic" or "substantially highly purified intrinsic" state. A highly purified intrinsic or substantially highly purified intrinsic oxide semiconductor film has few carrier generation sources, and thus can have a low carrier density. Thus, a transistor including the oxide semiconductor film rarely has negative threshold voltage (is rarely normally on). The highly purified intrinsic or substantially highly purified intrinsic oxide semiconductor film has a low density of defect states, and thus has few carrier traps. Accordingly, the transistor including the oxide semiconductor film has little variation in electrical characteristics and high reliability. Electric charge trapped by the carrier traps in the oxide semiconductor film takes a long time to be released, and might behave like fixed electric charge. Thus, the transistor which includes the oxide semiconductor film having high impurity concentration and a high density of defect states has unstable electrical characteristics in some cases.

With the use of the CAAC-OS film in a transistor, changes in electrical characteristics of the transistor due to irradiation with visible light or ultraviolet light is small.

The oxide semiconductor film 909 is preferably a CAAC-OS film.

In an oxide semiconductor having a crystal part such as a CAAC-OS, defects in the bulk can be further reduced. Further, when the surface flatness of the oxide semiconductor is increased, mobility higher than that of an oxide semiconductor in an amorphous state can be obtained. In order to increase the surface flatness, the oxide semiconductor is preferably formed over a flat surface. Specifically, the oxide semiconductor may be formed over a surface with an average surface roughness (Ra) of 1 nm or less, preferably 0.3 nm or less, more preferably 0.1 nm or less.

The oxide semiconductor film 909 can be formed by sputtering, molecular beam epitaxy (MBE), CVD, pulse laser deposition, atomic layer deposition (ALD), or the like as appropriate. Alternatively, the oxide semiconductor film 909 may be formed using a sputtering apparatus which performs deposition with surfaces of a plurality of substrates set substantially perpendicular to a surface of a sputtering target.

The oxide semiconductor film 909 is preferably a highly purified oxide semiconductor film which hardly contains impurities such as copper, aluminum, and chlorine. In the process of manufacturing the transistor, steps in which these impurities are not mixed into the oxide semiconductor film 909 or these impurities are not attached onto the surface of the oxide semiconductor film 909 are preferably selected as appropriate. In the case where the impurities are attached onto the surface of the oxide semiconductor film 909, the impurities on the surface of the oxide semiconductor film 909 are preferably removed by exposure to oxalic acid or dilute hydrofluoric acid or plasma treatment (e.g., N$_2$O plasma treatment). Specifically, the concentration of copper in the oxide semiconductor film 909 is 1×10$^{18}$ atoms/cm$^3$ or lower, preferably 1×10$^{17}$ atoms/cm$^3$ or lower. The concentration of aluminum in the oxide semiconductor film 909 is 1×10$^{18}$ atoms/cm$^3$ or lower. Further, the concentration of chlorine in the oxide semiconductor film 909 is 2×10$^{18}$ atoms/cm$^3$ or lower.

The source and drain electrodes 910 can be formed using a metal film containing an element selected from aluminum (Al), chromium (Cr), copper (Cu), tantalum (Ta), titanium (Ti), molybdenum (Mo), or tungsten (W), a metal nitride film containing any of the above elements (e.g., a titanium nitride film, a molybdenum nitride film, or a tungsten nitride film), or the like. Alternatively, a film of a high-melting-point metal such as Ti, Mo, or W or a metal nitride film thereof (e.g., a titanium nitride film, a molybdenum nitride film, or a tungsten nitride film) may be formed over or/and below a metal film such as an Al film or a Cu film. Alternatively, the source and drain electrodes 910 may be formed using a conductive metal oxide. As the conductive metal oxide, indium oxide (In$_2$O$_3$), tin oxide (SnO$_2$), zinc oxide (ZnO), indium oxide-tin oxide (In$_2$O$_3$—SnO$_2$), indium oxide-zinc oxide (In$_2$O$_3$—ZnO), or any of these metal oxide materials containing silicon oxide can be used. The source and drain electrodes 910 can be formed by sputtering or the like.

The gate insulating film 911 can be formed by plasma-enhanced CVD, sputtering, or the like. The gate insulating film 911 may be formed to have a single layer or a stack including one or more kinds of materials selected from silicon oxide, silicon oxynitride, aluminum oxide, aluminum oxynitride, hafnium oxide, gallium oxide, magnesium oxide, tantalum oxide, yttrium oxide, zirconium oxide, lanthanum oxide, and neodymium oxide.

When the gate insulating film 911 is formed using a high-k material such as hafnium oxide, yttrium oxide, hafnium silicate (HfSi$_x$O$_y$ (x>0, y>0)), hafnium silicate to which nitrogen is added (HfSiO$_x$N$_y$ (x>0, y>0)), hafnium aluminate (HfAl$_x$O$_y$ (x>0, y>0), or lanthanum oxide, gate leakage current can be reduced. The use of the gate insulating film 911 for a capacitor is preferable because it can increase the capacitance of the capacitor. Further, the gate insulating film 911 may have a single-layer structure or a layered structure.

The gate electrode 912 can be formed using a metal material such as molybdenum, titanium, tantalum, tungsten, aluminum, copper, chromium, neodymium, or scandium, or an alloy material containing any of these materials as its main component. Alternatively, a semiconductor film typified by a polycrystalline silicon film doped with an impurity element such as phosphorus, or a silicide film such as a nickel silicide film may be used as the gate electrode 912. The gate electrode 912 may have a single-layer structure or a layered structure. The gate electrode 912 can be formed by sputtering or the like.

The gate electrode 912 can be formed using a conductive material such as indium oxide-tin oxide, indium oxide containing tungsten oxide, indium zinc oxide containing tungsten oxide, indium oxide containing titanium oxide, indium tin oxide containing titanium oxide, indium oxide-zinc oxide, or indium tin oxide to which silicon oxide is added.

Further, as one layer of the gate electrode 912 that is in contact with the gate insulating film 911, a metal oxide containing nitrogen, specifically, an In—Ga—Zn—O film containing nitrogen, an In—Sn—O film containing nitrogen, an In—Ga—O film containing nitrogen, an In—Zn—O film containing nitrogen, a Sn—O film containing nitrogen, an In—O film containing nitrogen, or a metal nitride film (e.g., InN or SnN) can be used. These films each have a work function of 5 eV or higher, preferably 5.5 eV or higher. The threshold voltage of the transistor can be positive when any of these films is used as the gate electrode.

The interlayer insulating film 913 may be formed using a material which is similar to that of the base insulating film 908.

It is preferable that the interlayer insulating film 913 have low relative permittivity and sufficient thickness. For example, a silicon oxide film having a relative permittivity of approximately 3.8 and a thickness of 300 to 1000 nm may be used. A surface of the interlayer insulating film 913 has little fixed electric charge because of the influence of atmospheric components and the like, which might cause a shift in the threshold voltage of the transistor. Thus, it is preferable that the interlayer insulating film 913 have relative permittivity and thickness such that the influence of electric charge at the surface is sufficiently reduced.

The transistors 900 and 202 can be formed with the above structures. Further, the transistors 900 and 202 can be stacked, so that the storage device can be downsized.

This embodiment can be combined with any of the above embodiments as appropriate.

This application is based on Japanese Patent Application serial No. 2012-113102 filed with Japan Patent Office on May 17, 2012, the entire contents of which are hereby incorporated by reference.

What is claimed is:

1. A storage device comprising:
a memory cell comprising a first transistor; and
a write circuit comprising a constant current circuit and a first capacitor,
wherein a gate of the first transistor is electrically connected to the constant current circuit and the first capacitor through a word line,
wherein one of a source and a drain of the first transistor is electrically connected to a bit line,
wherein the write circuit is configured to set a potential of the word line to a first potential so that data is written to the memory cell, and
wherein the write circuit is configured to set the potential of the word line to a second potential by decreasing monotonically from the first potential to the second potential.

2. The storage device according to claim 1,
wherein the memory cell comprises a second capacitor,
wherein the other of the source and the drain of the first transistor is electrically connected to one electrode of the second capacitor, and
wherein the other electrode of the second capacitor is grounded.

3. The storage device according to claim 1,
wherein the memory cell comprises a second capacitor,
wherein the other of the source and the drain of the first transistor is electrically connected to one electrode of the second capacitor,
wherein the other electrode of the second capacitor is grounded, and
wherein electric charge is stored in the second capacitor when the data is written to the memory cell.

4. The storage device according to claim 1,
wherein the memory cell comprises a second transistor, and
wherein the other of the source and the drain of the first transistor is electrically connected to a gate of the second transistor.

5. The storage device according to claim 1, wherein a channel formation region of the first transistor comprises an oxide semiconductor film.

6. The storage device according to claim 1,
wherein a channel formation region of the first transistor comprises an oxide semiconductor film, and
wherein the oxide semiconductor film comprises indium, gallium, zinc, and oxygen.

7. A storage device comprising:
a memory cell comprising a first transistor; and
a write circuit comprising a constant current circuit and a first capacitor,
wherein a gate of the first transistor is electrically connected to the constant current circuit and the first capacitor through a word line,
wherein one of a source and a drain of the first transistor is electrically connected to a bit line,
wherein the write circuit is configured to set a potential of the word line to a first potential so that data is written to the memory cell, and
wherein the write circuit is configured to set the potential of the word line to a second potential by decreasing monotonically from the first potential to the second potential when a current flows through the constant current circuit and electric charge stored in the first capacitor are discharged.

8. The storage device according to claim 7,
wherein the memory cell comprises a second capacitor,
wherein the other of the source and the drain of the first transistor is electrically connected to one electrode of the second capacitor, and
wherein the other electrode of the second capacitor is grounded.

9. The storage device according to claim 7,
wherein the memory cell comprises a second capacitor,
wherein the other of the source and the drain of the first transistor is electrically connected to one electrode of the second capacitor,
wherein the other electrode of the second capacitor is grounded, and
wherein electric charge is stored in the second capacitor when the data is written to the memory cell.

10. The storage device according to claim 7,
wherein the memory cell comprises a second transistor, and
wherein the other of the source and the drain of the first transistor is electrically connected to a gate of the second transistor.

11. The storage device according to claim 7, wherein a channel formation region of the first transistor comprises an oxide semiconductor film.

12. The storage device according to claim 7,
wherein a channel formation region of the first transistor comprises an oxide semiconductor film, and
wherein the oxide semiconductor film comprises indium, gallium, zinc, and oxygen.

13. A driving method of a storage device comprising:
a memory cell comprising a first transistor; and
a write circuit comprising a constant current circuit and a first capacitor,
wherein a gate of the first transistor is electrically connected to the constant current circuit and the first capacitor through a word line, and
wherein one of a source and a drain of the first transistor is electrically connected to a bit line,
the driving method comprising the steps of:
setting a potential of the word line to a first potential so that data is written to the memory cell, and
setting the potential of the word line to a second potential by decreasing monotonically from the first potential to the second potential.

14. The driving method of a storage device according to claim 13,
wherein the memory cell comprises a second capacitor,
wherein the other of the source and the drain of the first transistor is electrically connected to one electrode of the second capacitor,
wherein the other electrode of the second capacitor is grounded, and
wherein electric charge is stored in the second capacitor when the data is written to the memory cell.

15. The storage device according to claim 1, wherein the potential of the word line is set to the second potential by decreasing gradually from the first potential to the second potential.

16. The storage device according to claim 13, wherein the potential of the word line is set to the second potential by decreasing gradually from the first potential to the second potential.

17. The driving method of a storage device according to claim 13, wherein the potential of the word line is set to the second potential by decreasing gradually from the first potential to the second potential.

18. The storage device according to claim 1, wherein the write circuit further comprises a third transistor,
wherein the first transistor is provided over the third transistor with an insulating film provided therebetween.

19. The storage device according to claim 7, wherein the write circuit further comprises a third transistor,
wherein the first transistor is provided over the third transistor with an insulating film provided therebetween.

* * * * *